(12) United States Patent
Kobayashi

(10) Patent No.: US 7,414,563 B2
(45) Date of Patent: Aug. 19, 2008

(54) ANALOG-TO-DIGITAL CONVERTER WITH A PLURALITY OF CONVERSIONS

(75) Inventor: Shigeto Kobayashi, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/700,064

(22) Filed: Jan. 31, 2007

(65) Prior Publication Data
US 2007/0176817 A1    Aug. 2, 2007

(30) Foreign Application Priority Data
Jan. 31, 2006    (JP)    ............... 2006-022493

(51) Int. Cl.
*H03M 1/34* (2006.01)
(52) U.S. Cl. ...................... 341/158; 341/155
(58) Field of Classification Search .......... 341/120–165
See application file for complete search history.

(56) References Cited

U.S. PATENT DOCUMENTS

| | | | |
|---|---|---|---|
| 6,414,619 B1 * | 7/2002 | Swanson | 341/155 |
| 6,859,158 B2 * | 2/2005 | Wada et al. | 341/155 |
| 6,900,749 B2 * | 5/2005 | Tani et al. | 341/118 |
| 6,909,391 B2 * | 6/2005 | Rossi | 341/161 |
| 7,002,507 B2 * | 2/2006 | Kobayashi et al. | 341/162 |
| 7,084,803 B2 * | 8/2006 | Kobayashi et al. | 341/162 |
| 7,154,426 B2 * | 12/2006 | Tani et al. | 341/155 |
| 7,224,306 B2 * | 5/2007 | Kobayashi | 341/155 |

FOREIGN PATENT DOCUMENTS

JP          9-275342          10/1997

* cited by examiner

*Primary Examiner*—Lam T Mai
(74) *Attorney, Agent, or Firm*—McDermott Will & Emery LLP

(57) ABSTRACT

An A-D converter includes an A-D converter circuit, a D-A converter circuit, a subtraction circuit, a second amplifier circuit, a reference voltage control circuit, a timing control circuit 18, an amplifier control circuit 19, and an output circuit. The reference voltage control circuit controls the range of reference voltage in the A-D converter according to a step or stage of conversion in the A-D converter. In particular, the reference voltage control circuit performs a control so that the range of reference voltage in the A-D converter circuit at the time of conversion in the third step is larger than that in the first and the second step.

12 Claims, 21 Drawing Sheets

FIG.14

| 2ND A-D CONVERTER CIRCUIT 20 | AZ | ACTIVE | AZ | ACTIVE | AZ | ACTIVE | AZ | ACTIVE |
|---|---|---|---|---|---|---|---|---|
| SIGNAL INPUTTED | Vref | Vin | Vin | Vref | Vref | Vin | Vin | Vref |

| 2ND A-D CONVERTER CIRCUIT 20 | D9~D6 | D1~D0 | D9~D6 | D1~D0 |
|---|---|---|---|---|
| BIAS VOLTAGE Vbias | SMALL | LARGE | SMALL | LARGE |

FIG.19

| 2ND A-D CONVERTER CIRCUIT 20 | D 9 ~ D 6 | D 1 ~ D 0 | D 9 ~ D 6 | D 1 ~ D 0 |
|---|---|---|---|---|
| TYPE OF OPERATION | GATE-INPUT TYPE | CAPACITANCE-INPUT TYPE | GATE-INPUT TYPE | CAPACITANCE-INPUT TYPE |

ANALOG-TO-DIGITAL CONVERTER WITH A PLURALITY OF CONVERSIONS

BACKGROUND OF THE INVENTION

1. Field of the Invention

The present invention generally relates to analog-to-digital converters and it particularly relates to an analog-to-digital converter in which analog signals are converted to digital signals in such a manner that the analog signal is converted a plurality of times.

2. Description of the Related Art

As an example of a circuit for converting the inputted analog signals into the digital signals, there is available a pipeline-type A-D converter. A pipeline-type A-D converter is configured such that sub-A-D converters of low bits are connected in a plurality of stages. The inputted analog signal is A-D converted in stages through the respective sub-A-D converters. Each sub-A-D converter is provided with a plurality of comparators, and each comparator compares the inputted analog signal with the reference voltage so as to convert the analog signal into the digital signals.

When the inputted analog signal is to be A-D converted from the higher-order bit to the lower-order bit in stages, a redundancy range is provided in the sub-A-D converters. As a result, the result of conversion to the higher-order bits can be corrected based on the result of conversion to the lower-order bits. However, the A-D conversion terminates when the conversion to the least significant bit has been done. Thus, the above-mentioned correction will not be performed on the result of conversion to the least significant bit. This will directly affect the precision of the analog-to-digital converter as a whole.

SUMMARY OF THE INVENTION

The present invention has been made in recognition of the aforementioned circumstances and a general purpose thereof is to improve the accuracy of an A-D converter.

In order to solve the above problems to be solved, an analog-to-digital converter according to one embodiment of the present invention converts an input analog signal to a digital value of a predetermined number of bits as a result of a plurality of conversions, and it comprises: a conversion unit which converts the input analog signal to a digital value of less than the predetermined number of bits; and a control unit which controls conversion accuracy of the conversion unit. The conversion unit is put to a common use in a plurality n of conversions that include a conversion to the least significant bit, and in a case of n=2, the control unit controls a conversion accuracy of the conversion unit in a manner such that the conversion accuracy of the conversion unit at the time of converting to the least significant bit is set higher than the conversion accuracy of the conversion unit prior to the converting to the least significant bit and, in a case of n≧3, the control unit controls a conversion accuracy of the conversion unit in a manner such that the conversion accuracy of the conversion unit at the time of converting to the least significant bit is set higher than the conversion accuracy of any one of conversions by the conversion unit prior to the converting to the least significant bit.

Another embodiment of the present invention relates also to an analog-to-digital converter. This analog-to-digital converter is an A-D converter which converts an input analog signal to a digital value of a predetermined number of bits as a result of a plurality of conversions through m stages connected in series, and the analog-to-digital converter is characterized in that each of the stages includes a conversion unit which converts the input analog signal to a digital value of less than the predetermined number of bits, and in a case of m=2, the conversion accuracy of a conversion unit included in a subsequent stage among the m stages is set higher than the conversion accuracy of a conversion unit included in a stage prior to the subsequent stage and, in a case of m≧3, the conversion accuracy of a conversion-unit included in a last stage among the m stages is set higher than the conversion accuracy of a conversion unit included in any one of stages prior to the last stage.

It is to be noted that any arbitrary combination of the above-described structural components and expressions converted among a method, an apparatus, a system and so forth are all effective as and encompassed by the present embodiments.

BRIEF DESCRIPTION OF THE DRAWINGS

Embodiments will now be described by way of examples only, with reference to the accompanying drawings which are meant to be exemplary, not limiting and wherein like elements are numbered alike in several Figures in which:

FIG. 14 illustrates a temporal change in signal inputted to the second A-D converter circuit shown in FIG. 9;

FIG. 17 illustrates a temporal change in bias voltage Vbias inputted from a current control circuit of FIG. 15 to a comparator of FIG. 16;

FIG. 19 illustrates a temporal change in the operation type of a second A-D converter circuit shown in FIG. 18;

DETAILED DESCRIPTION OF THE INVENTION

Figure 1:
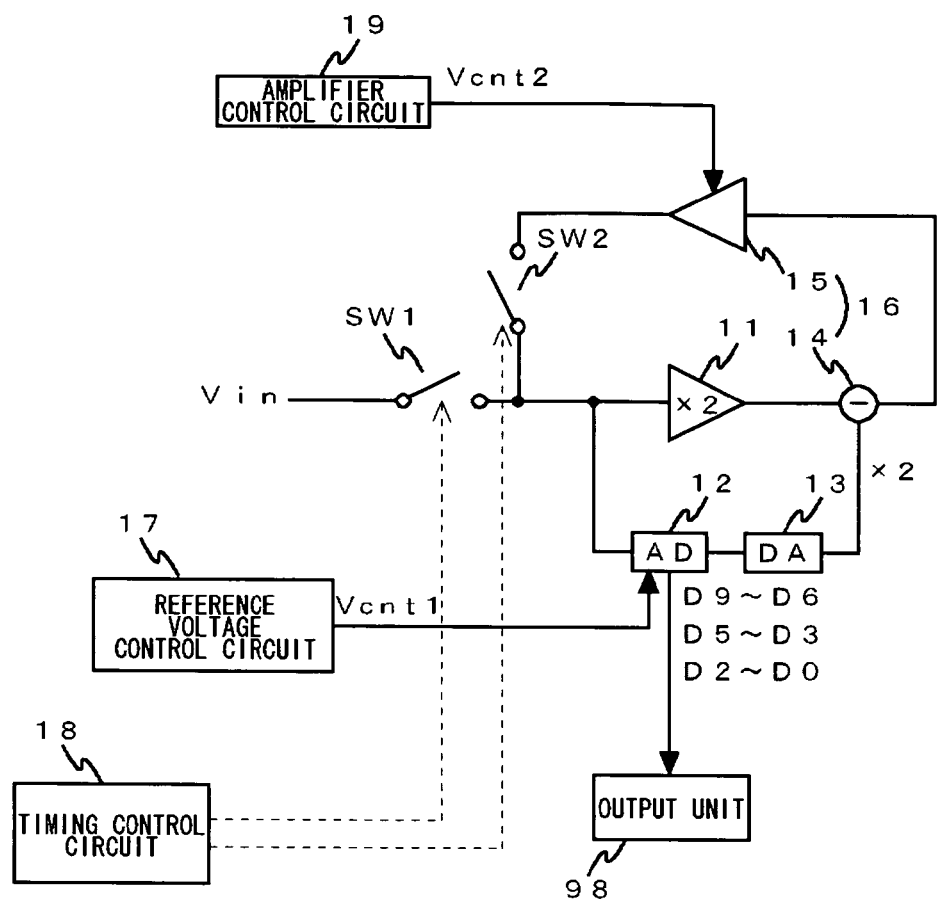
FIG. 1 illustrates a structure of an A-D converter according to a first embodiment of the present invention.

The invention will now be described by reference to the preferred embodiments. This does not intend to limit the scope of the present invention, but to exemplify the invention.

A preferred embodiment according to the present invention relates to an analog-to-digital converter (hereinafter referred to as "A-D converter") which converts an inputted analog signal into digital signals in stages. This A-D converter is so configured as to enhance the precision of the A-D converter as a whole in a manner such that the accuracy of conversion to the least significant bit is set higher than the accuracy of conversion to the higher-order bits.

Outline of the Embodiment

An analog-to-digital converter according to one preferred embodiment of the present invention converts an input analog signal to a digital value of a predetermined number of bits as a result of a plurality of conversions, and it comprises: a conversion unit which converts the input analog signal to a digital value of less than the predetermined number of bits; and a control unit which controls conversion accuracy of the conversion unit. The conversion unit is put to a common use in a plurality n of conversions that include a conversion to the least significant bit, and in a case of n=2, the control unit controls a conversion accuracy of the conversion unit in a manner such that the conversion accuracy of the conversion unit at the time of converting to the least significant bit is set higher than the conversion accuracy of the conversion unit prior to the converting to the least significant bit and, in a case of n≧3, the control unit controls a conversion accuracy of the conversion unit in a manner such that the conversion accuracy of the conversion unit at the time of converting to the least significant bit is set higher than the conversion accuracy of any one of conversions by the conversion unit prior to the converting to the least significant bit.

According to this embodiment, the accuracy of conversion to the least significant bit which dominantly affects the accuracy of an analog-to-digital converter as a whole is raised, so that the conversion accuracy of the analog-to-digital converter can be effectively improved.

In the case of n=2, the control unit may perform a control in a manner such that a range of reference voltages in the conversion unit at the time of converting to the least significant bit is set larger than a range of reference voltages in the conversion unit in any one of conversions prior to the converting to the least significant bit and, in the case of n≧3, the control unit may perform a control in a manner such that a range of reference voltages in the conversion unit at the time of converting to the least significant bit is set larger than a range of reference voltages in the conversion unit in any one of conversions prior to the converting to the least significant bit. In such a case, setting larger the range of reference voltages in the conversion unit at the time of converting to the least significant bit can reduce the effect of offsets and the like of the comparison circuit included in the conversion unit on the conversion accuracy. Thereby, the accuracy of conversion to the least significant bit is enhanced.

The conversion unit may have a first mode and a second mode wherein the first mode is such that the input analog signal is sampled at the end of a non-operating period and the predetermined reference voltage is received during a comparative operation period and the second mode is such that the predetermined reference voltage is sampled at the end of a non-operating period and the input analog signal is received during a comparative period. In a case of n=2, the control unit may perform a control in a manner such that the mode of the conversion unit, at the time of a conversion prior to converting to the least significant bit, is set to the second mode and the mode of the conversion unit, at the time of converting to the least significant bit, is set to the first mode and, in a case of n≧3, the control unit may perform a control in a manner such that the mode of the conversion unit, at the time of any one of conversions by the conversion unit prior to converting to the least significant bit, is set to the second mode and the mode of the conversion unit, at the time of converting to the least significant bit, is set to the first mode.

In such a case, at the time of converting to the least significant bit the conversion unit receives the input of reference voltage whose variation is smaller as compared with the analog signal inputted during a comparative operating period, so that the accuracy of conversion to the least significant bit is enhanced. Also, the mode of the conversion unit in a conversion prior to the conversion to the least significant bit is set to the second mode, so that the timing at which the input analog signal is received can be designed flexibly. As a result, the degree of freedom in designing the analog-to-digital converter is increased.

In the case of n=2, the control unit may perform a control in a manner such that a current supplied to a comparator included in the conversion unit at the time of converting to the least significant bit is varied relative to a current supplied to a comparator included in the conversion unit at the time of a conversion prior to the converting to the least significant bit and, in the case of n≧3, the control unit may perform a control in a manner such that a current supplied to a comparator included in the conversion unit at the time of converting to the least significant bit is varied relative to a current supplied to a comparator included in the conversion unit at the time of any one of conversions prior to the converting to the least significant bit. The accuracy of conversion to the least significant bit can be raised according to the specifications of an analog-to-digital converter.

"is varied" may be "set higher". In such a case, the operation of comparison in a comparator included in a conversion unit at the time of converting to the least significant bit is accelerated and therefore the accuracy of conversion to the least significant bit is raised. "is varied" may be "set lower". In such a case, the range of values that the output of a comparator can possibly take is enlarged and therefore the accuracy of conversion to the least significant bit is raised. In other words, "is varied" may be such that the value of a current supplied to a comparator in a conversion unit is varied between at the time of converting to the least significant bit and at the time of a conversion prior to the converting to the least significant bit.

In the case of n=2, the control unit may perform a control in a manner such that an operation of the conversion unit at the time of a conversion prior to converting to the least significant bit is set to a first type in which the input analog signal is inputted to a comparator included in the conversion unit without involving a capacitor, and may perform a control in a manner such that an operation of the conversion unit at the time of the converting to the least significant bit is set to a second type in which the input analog signal is inputted to the comparator included in the conversion unit via a capacitor and, in the case of n≧3, the control unit may perform a control in a manner such that an operation of the conversion unit at the time of any one of conversions prior to converting to the least significant bit is set to the first type and may perform a control in a manner such that an operation of the conversion unit at the time of the converting to the least significant bit is set to the second type. As a result, in the case when the conversion unit performs a conversion prior to the converting to the least significant bit, the conversion unit is set to the first type, so that the power consumption can be suppressed. Also, in the case when the conversion unit performs the converting to the least significant bit, the conversion unit is set to the second type, so that the accuracy of conversion to the least significant bit can be effectively raised. Hence, the conversion accuracy can be raised while the power consumption of an analog-to-digital converter is suppressed to the minimum.

Another preferred embodiment of the present invention relates also to an analog-to-digital converter. This analog-to-digital converter is an A-D converter which converts an input analog signal to a digital value of a predetermined number of bits as a result of a plurality of conversions through m stages connected in series, and the analog-to-digital converter is characterized in that each of the stages includes a conversion unit which converts the input analog signal to a digital value of less than the predetermined number of bits, and in a case of m=2, the conversion accuracy of a conversion unit included in a subsequent stage among the m stages is set higher than the conversion accuracy of a conversion unit included in a stage prior to the subsequent stage and, in a case of m≧3, the conversion accuracy of a conversion unit included in a last stage among the m stages is set higher than the conversion accuracy of a conversion unit included in any one of stages prior to the last stage.

According to this embodiment, irrespective of whether the conversion unit at each stage is put to a common use or not, the accuracy of conversion to the least significant bit is raised, so that the conversion accuracy of an analog-to-digital converter can be effectively improved.

In the case of m=2, a range of reference voltages in the conversion unit included in the subsequent stage may be set larger than a range of reference voltages in the conversion unit included in the stage prior to the subsequent stage and, in the case of m≧3, a range of reference voltages in the conversion unit included in the last stage may be set larger than a range of reference voltages in a conversion unit included in any one of stages prior to the last stage.

In a case of m=2, an operation of the conversion unit included in the subsequent stage may be a first mode in which the input analog signal is sampled at the end of a non-operating period and the predetermined reference voltage is received during a comparative operating period, and an operation of the conversion unit included in a stage prior to the subsequent stage may be a second mode in which the predetermined reference voltage is sampled at the end of a non-operating period and the input analog signal is received during a comparative operating period, and in a case of m≧3, an operation of the conversion unit included in a last stage may be a first mode in which the input analog signal is sampled at the end of a non-operating period and the predetermined reference voltage is received during a comparative operating period, and an operation of the conversion unit included in any one of stages prior to the last stage may be a second mode in which the predetermined reference voltage is sampled at the end of a non-operating period and the input analog signal is received during a comparative operating period.

In the case of m=2, the level of a current supplied to a comparator included in the conversion unit in the subsequent stage may differ from the level of a current supplied to a comparator included in a stage prior to the subsequent stage. In the case of m≧3, the level of a current supplied to a comparator included in the conversion unit in the last stage may differ from the level of a current supplied to a comparator included in a conversion unit in any one of stages prior to the last stage.

In the case of m=2, a conversion unit included in a stage prior to the subsequent stage may be of a first type in which the analog signal is inputted to a comparator of the conversion unit without involving a capacitor, and a conversion unit included in the last stage may be of a second type in which the analog signal is inputted to a comparator of the conversion unit via a capacitor, and in the case of m≧3, any one of conversion units included in a stage prior to the last stage may be of a first type in which the analog signal is inputted to a comparator of any one of the conversion units without involving a capacitor, and a conversion unit included in the last stage may be of a second type in which the analog signal is inputted to a comparator of the conversion unit included in the last stage via a capacitor.

First Embodiment

A description is given of an A-D converter so configured as to raise the accuracy of conversion to the least significant bit in a manner that the range of reference voltage for the A-D converter at the time of conversion to the least significant bit is set larger than that at the time of conversion to the higher-order bits. The range of reference voltage means an interval at which the level of a plurality of reference voltages to be compared with is represented in the A-D converter.

FIG. 1 illustrates a structure of an A-D converter 100 according to a first embodiment of the present invention. The A-D converter includes a first switch SW1, a second switch SW2, a first amplifier circuit 11, an A-D converter circuit 12, a D-A converter circuit 13, a subtraction circuit 14, a second amplifier circuit 15, a reference voltage control circuit 17, a timing control circuit 18, an amplifier control circuit 19 and an output unit 98.

An analog signal Vin is inputted to the first amplifier circuit 11 and the A-D converter circuit 12 via the first switch SW1. The timing at which the first switch SW1 is turned on and off is given by the timing control circuit 18. The A-D converter circuit 12 converts the analog signal Vin into a digital value of maximum 4 bits and then the converted signal is outputted to the D-A converter circuit 13. The D-A converter circuit 13 converts the digital value of maximum 4 bits outputted from the A-D converter circuit 12, into an analog signal.

The first amplifier circuit 11 amplifies the analog signal Vin. The gain of the amplifier circuit is 2×. The subtraction circuit 14 subtracts the output of the D-A converter circuit 13 from the output of the first amplifier circuit 11. Here, the analog value outputted from the D-A converter 13 is amplified by the factor of two in correspondence with the gain of the first amplifier circuit 13. The second amplifier circuit 15 amplifies the output of the subtraction circuit 14. The gain of the second amplifier circuit 15 is controlled by an amplification control signal Vcnt2 of the amplifier control circuit 19, as will be discussed later. The output of the second amplifier circuit 15 is fed back to the first amplifier circuit 11 and the A-D converter circuit 12 via the second switch SW2. The timing at which the second switch SW2 is turned on and off is supplied by the timing control circuit 18. Note that in place of the subtraction circuit 14 and the second amplifier circuit 15 there may be provided an subtractor-amplifier circuit 16 which is an amplifier circuit provided with a subtraction function. According to this configuration, the circuitry can be simplified.

The output of the second amplifier circuit 15 which has been fed back via the second switch SW2 is inputted to the first amplifier circuit 11 and the A-D converter circuit 12. The A-D converter circuit 12 converts the fad-back analog value to a digital value of 3 bits, so as to output it to the D-A converter circuit 13. The first amplifier circuit 11 amplifies the fed-back analog value. The subtraction circuit 14 subtracts the output of the D-A converter circuit 13 from the output of the first amplifier circuit 11. The second amplifier circuit 15 amplifies the output of the subtraction circuit 14. The output of the second amplifier circuit 15 is fed back to the first amplifier circuit 11 and the A-D converter circuit 12 via the second switch SW2.

The number of cyclic processings by the feedback of the second amplifier circuit 15 is two. That is, the A-D converter 100 according to the first embodiment converts the analog signal Vin to the digital value of 10 bits in three steps. At a first step of initial processing, the first switch SW1 is turned on and the second switch SW2 is turned off. In the first step, the A-D converter circuit 12 produces 1st to 4th bits (D9 to D6), which are higher 1st to 4th bits of 10-bit digital value that the A-D converter 100 will finally output. In a second and a third step, the first switch SW1 is turned off and the second switch SW2 is turned on. In the second and the third step, the A-D converter circuit 12 produces 5th to 7th bits (D5 to D3) and 8th to 10th bits (D2 to D0), which are higher 5th to 7th bits and higher 8th to 10th bits of 10-bit digital value that the A-D converter 100 will finally output, respectively. The conversion by the A-D converter circuit 12 in the third step corresponds to the conversion to the least significant bit. The digital values (D9 to D6, D5 to D3, D2 to D0) outputted sequentially from the A-D converter circuit 12 are inputted to the output unit 98. The output unit 98 corrects the inputted digital values, based on a redundancy range described later. The output unit 98 outputs the corrected digital values parallely.

A redundancy range is provided in the conversion by the A-D converter circuit 12 at the second and the third step. Thus, the result of conversion by the A-D converter circuit 12 at the first and the second step can be corrected based on the result of conversion by the A-D converter circuit 12 at the second and the third step. In generalization, the result of conversion by the converter circuit 12 at a given step can be corrected based on the result of conversion by the A-D converter 12 at a step after said given step. Since as for the result of conversion by the A-D converter circuit 12 at the final step there is no subsequent step to the final step, the above correction cannot be done. In the light of this, there are provided the reference voltage control circuit 17 and the amplifier control circuit 19 in the first embodiment to raise the conversion accuracy of the A-D converter circuit 12 at the third step which corresponds to the final step. Note that the correction based on a redundancy range is a known technique and therefore the detailed explanation thereof is omitted here.

The reference voltage control circuit 17 controls the range of reference voltage in the A-D converter circuit 12 by a reference control signal Vcnt1 according to a level or step of conversion in the A-D converter 100. More specifically, the reference voltage control circuit 17 controls the range of reference voltage in the A-D converter circuit 12 in the third step in a manner that it is set to a range larger than that of reference voltage in the A-D converter circuit 12 in the first and the second step. The structure with which to control the range of reference voltage in the A-D converter circuit 12 will be described later.

The amplifier control circuit 19 controls the gain of the second amplifier circuit 15 in accordance with the range of reference voltage in the A-D converter circuit 12. More specifically, the amplifier control circuit 19 is synchronized to the timing at which the range of reference voltage in the A-D converter circuit 12 is doubled by the reference voltage control circuit 17, so as to switch the gain of the second amplifier circuit 15 from 4× to 8×. The structure in which the gain of the second amplifier circuit 15 is controlled will be described later.

Figure 2:
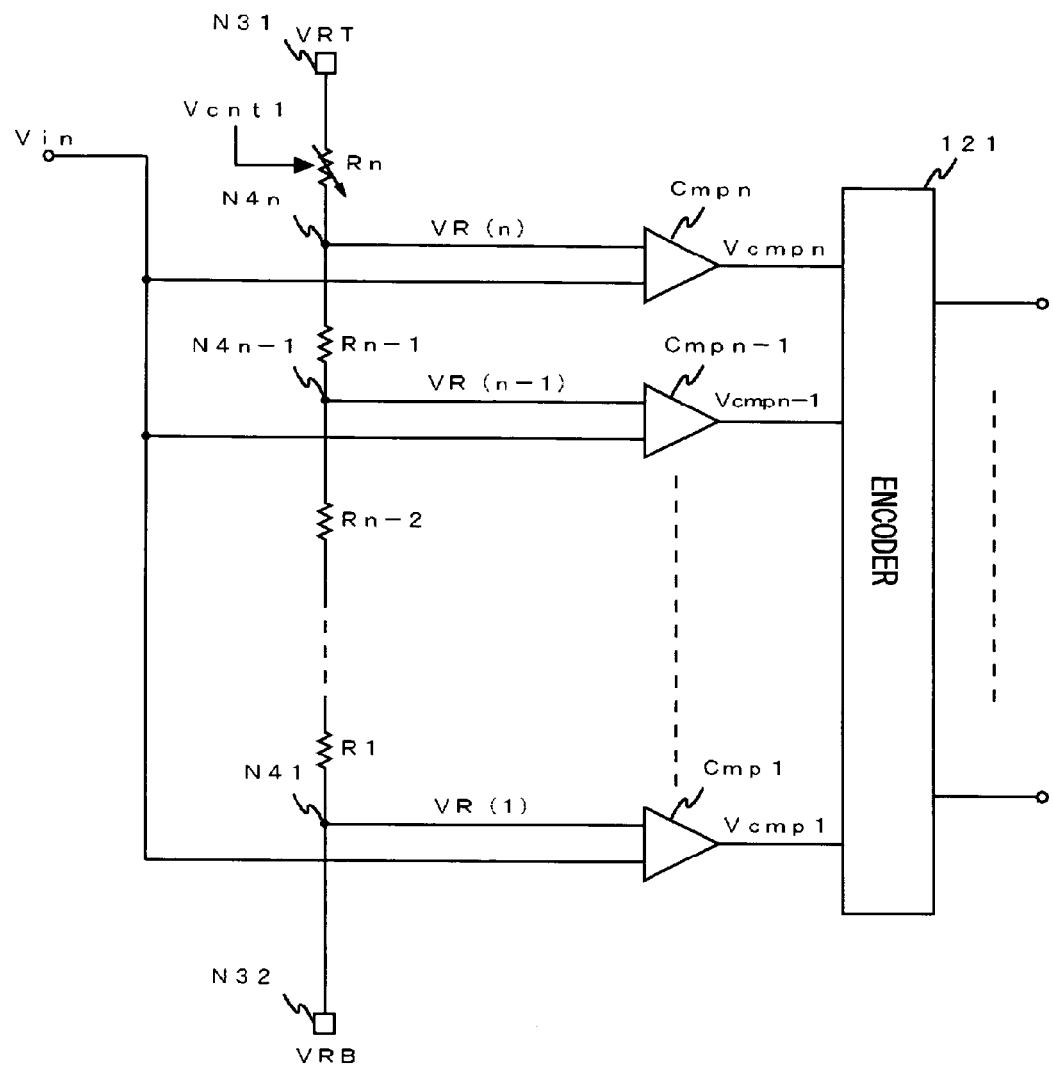
FIG. 2 is a circuit diagram showing a structure of the A-D converter circuit shown in FIG. 1.

A description is now given of a structure to control the range of reference voltages in the A-D converter circuit 12. FIG. 2 shows a structure of the A-D converter circuit 12 shown in FIG. 1. The A-D converter circuit 12 uses the flash method in which a plurality of comparators are used to compare reference voltages, in parallel, with the analog input. Though the case of single-ended input is shown in FIG. 2, it is obvious to the skilled in the art that the structure of FIG. 2 can be easily extended to the case of differential inputs.

Referring to FIG. 2, the A-D converter circuit 12 is comprised of resistors R1 to Rn, comparator circuits Cmp1 to Cmpn, and an encoder 121. The resistors R1 to Rn are connected in series between a high-potential-side node N31 that receives a high-potential-side reference voltage VRT and a low-potential-side node N32 that receives a low-potential-side reference voltage VRB. The low-potential-side nodes of the resistors R1 to Rn are denoted by nodes N41 to N4n. The potentials VR(1) to VR(n) of the nodes N41 to N4n are reference voltages of comparator circuits Cmp1 to Cmpn. The resistance values of the resistors R1 to Rn−1 are each equal. Thus, the reference voltages VR(1) to VR(n) are n reference voltages having the intervals of equal potential. The most significant resistor Rn is a variable resistor. The resistance value of the resistor Rn is controlled by the reference control signal Vcnt1 outputted from the reference voltage control circuit 17 of FIG. 1. The control of the resistance value of the resistor Rn will be described later.

The analog signal Vin is inputted to the noninverting input terminals of the comparator circuits Cmp1 to Cmpn. The reference voltages VR(1) to VR(n), which are potentials of the nodes N41 to N4n, are inputted to the inverting input terminals of the comparator circuits Cmp1 to Cmpn, respectively. Hence, if the analog signal Vin is greater than the reference voltages VR(1) to VR(n), respectively, the output signals Vcmp1 to Vcmpn of the comparator circuits Cmp1 to Cmpn will be high levels. Conversely, if the analog signal Vin is less than the reference voltages VR(1) to VR(n), respectively, the output signals Vcmp1 to Vcmpn of the comparator circuits Cmp1 to Cmpn will be low levels. The output signal Vcmp1 to Vcmpn of the comparator circuits Cmp1 to Cmpn are inputted to the encoder 121. The encoder 121 outputs binary codes corresponding to the inputted signals.

A description will now be given of controlling the above-mentioned resistance value of the resistor Rn. In FIG. 2, the range of reference voltages in the A-D converter circuit 12 is proportional to a potential difference Vrng which is the difference between the potential VR(n) of the node 4n and the potential VR(1) (=VRB) of the node 41. The potential difference Vrng is expressed by the following Equation (1).

$$Vrng = (R1 + R2 + \ldots + Rn{-}1) \times (VRT - VRB)/(R1 + R2 + \ldots + Rn) \quad (1)$$

In the first embodiment, the resistance value of the resistor Rn is controlled in a manner that the range of reference voltages at the time of conversion in the third step is twice as large as the range of reference voltage at the time of conversion in the first and the second step.

For example, the resistance value of the resistor Rn is so controlled as to be a value, expressed by the following Equa tion (2), at the time of conversion in the first and the second step.

$$Rn = R1 + R2 + \ldots + Rn-1 \quad (2)$$

The resistance value of the resistor Rn is so controlled as to be 0 at the time of conversion in the third step. If the resistance value of the resistor Rn is controlled as above, the potential difference Vrng at the time of conversion in the first and the second step will be (VRT−VRB)/2 by Equation (1) and the potential difference Vrng at the time of conversion in the third step will be VRT−VRB. As described above, the range of reference voltages increases proportionally to the potential difference Vrng, so that the range of reference voltage at the time of conversion in the third step is twice as much as the range of reference voltages at the time of conversion in the first and the second step. In place of the control in which the resistance value of the resistor Rn is so controlled as to be 0 at the time of conversion in the third step, a switch (not shown in FIG. 2) by which to short-circuit the resistor Rn may be turned on at the time of conversion in the third step.

Figure 3:
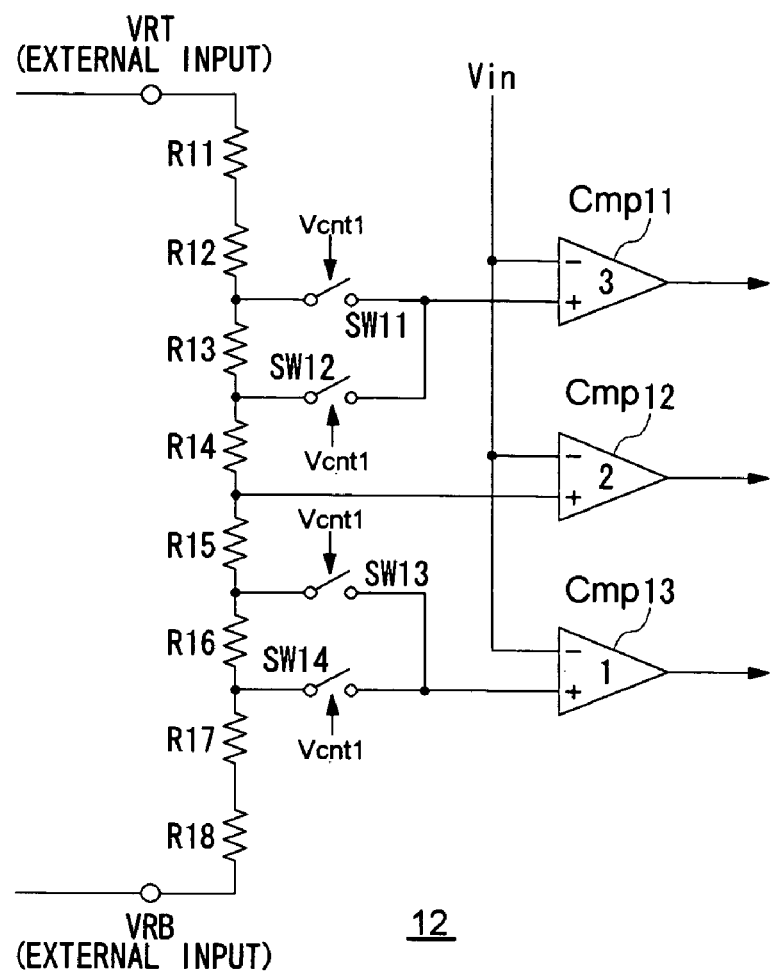
FIG. 3 is a circuit diagram showing another structural example of the A-D converter circuit shown in FIG. 1.

FIG. 3 illustrates another structural example of the A-D converter circuit 12 shown in FIG. 1. This A-D converter circuit illustrates an example of 2-bit conversion without the redundancy bits. Though the case of single-ended input is shown in FIG. 3, it is obvious to the skilled in the art that the structure of FIG. 3 can be easily extended to the case of differential inputs.

The A-D converter circuit 12 shown in FIG. 3 includes resistors R11 to R18, switches SW11 to SW14, and comparator circuits Cmp11 to Cmp13. The structure corresponding to the encoder 121 of FIG. 2 is omitted in FIG. 3. The resistors R11 to R18 are connected in series between the high-potential-side reference voltage VRT and the low-potential-side reference voltage VRB. The connection point of the resistor R12 and the resistor R13 is connected with the noninverting input terminal of the comparator circuit Cmp11 via the switch SW11. The connection point of the resistor R13 and the resistor R14 is connected with the noninverting input terminal of the comparator circuit Cmp11 via the switch SW12. The connection point of the resistor R15 and the resistor R16 is connected with the noninverting input terminal of the comparator circuit Cmp13 via the switch SW13. The connection point of the resistor R16 and the resistor R17 is connected with the noninverting input terminal of the comparator circuit Cmp13 via the switch SW14. The connection point of the resistor R14 and the resistor R15 are connected with the noninverting input terminal of the comparator circuit Cmp12. The analog signal Vin is inputted to each of the inverting input terminals of the comparator circuits D11 to D13.

As the switch SW11 and the switch SW14 are turned on and the switch SW12 and the switch SW13 are turned off, the range of reference voltages in the A-D converter circuit 12 is proportional to ½ of the difference between the high-potential-side reference voltage VRT and the low-potential-side reference voltage VRB. As the switch SW11 and the switch SW14 are turned off and the switch SW12 and the switch SW13 are turned on, the range of reference voltages in the A-D converter circuit 12 is proportional to ¼ of the difference between the high-potential-side reference voltage VRT and the low-potential-side reference voltage VRB. The ON and OFF of the switches SW11 to SW14 is controlled by the reference control signal Vcnt1 outputted from the reference voltage control circuit 17 shown in FIG. 1. In the first embodiment, the ON and OFF of the switches SW11 to SW14 is controlled in a manner that the range of reference voltages at the time of conversion at the third step is twice as much as the range of reference voltages at the time of conversion in the first and the second step. Each of the comparator circuits Cmp11 to Cmp13 compares the analog signal Vin with the reference voltage inputted to each of the comparator circuits Cmp11 to Cmp13. The outputs of the comparator circuits Cmp11 to Cmp13 are inputted to a not-shown encoder and converted to binary codes.

Figure 4A:
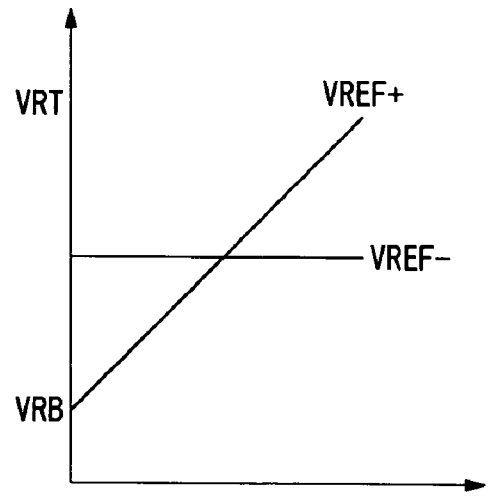
FIGS. 4A and 4B illustrate reference voltages which are to be differentially inputted to the comparator circuits included in the A-D converter circuit of FIG. 1.
Figure 4B:
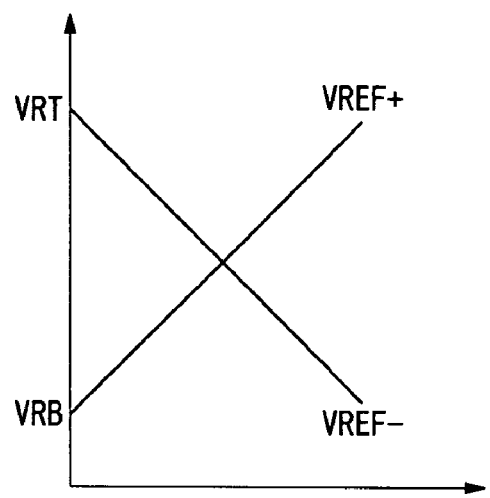

A description will now be given of another example in which the range of reference voltages in the A-D converter circuit 12 is controlled. FIGS. 4A and 4B illustrate reference voltages which are to be differentially inputted to the comparator circuits included in the A-D converter circuit 12 of FIG. 1. FIG. 4A illustrates a case where the level of a reference voltage Vref− of reversed phase is fixed and the range of a reference voltage Vref+ of a positive phase is set to VRT-VRB. FIG. 4B illustrates a case where the range of both reference voltage Vref+ of a positive phase and reference voltage Vref− of reversed phase is set to VRT-VRB.

In the comparator circuit, a value obtained after the reference voltage Vref− of reversed phase is subtracted from the reference voltage Vref+ of a positive phase is a reference voltage as a differential input. Thus, the range of reference voltages as a differential input as in a case shown in FIG. 4B is twice as much as the range of reference voltages as a differential input as in a case shown in FIG. 4A. That is, the range of reference voltages as a differential input as in the case shown in FIG. 4A is proportional to ½(high-potential-side reference voltage VRT—low-potential-side reference voltage VRB)—½(low-potential-side reference voltage VRB—high-potential-side reference voltage VRT). In contrast to this, the range of reference voltages as a differential input as in the case shown in FIG. 4B is proportional to (high-potential-side reference voltage VRT—low-potential-side reference voltage VRB)—(low-potential-side reference voltage VRB—high-potential-side reference voltage VRT).

There is provided a switch connected to a terminal which receives the reference voltage Vref− of reversed phase so as to switch between the input of Vref− shown in FIG. 4A and the input of Vref− shown in FIG. 4B. As a result, the range of reference voltages as a differential input is controlled. The switching of the input by use of the above-described switch is controlled by the reference control signal Vcnt1 outputted from the reference voltage control circuit 17 of FIG. 1. According to the first embodiment, a control is performed in a manner such that the range of reference voltages as a differential input at the time of conversion in the third step is double the range of reference voltages as a differential input at the time of conversion in the first and the second step. That is, the reference voltage control circuit 17 of FIG. 1 controls the above-described switch so that Vref− shown in FIG. 4A is inputted to the comparator circuits as a reference voltage of reversed phase at the time of conversion in the first and the second step. Also, the reference voltage control circuit 17 of FIG. 1 controls the above-described switch so that Vref− shown in FIG. 4B is inputted to the comparator circuits as a reference voltage at the time of conversion in the third step. Thereby, the range of reference voltages as a differential input at the time of conversion in the third step becomes double the range of reference voltages as a differential input at the time of conversion in the first and the second step.

Figure 5:
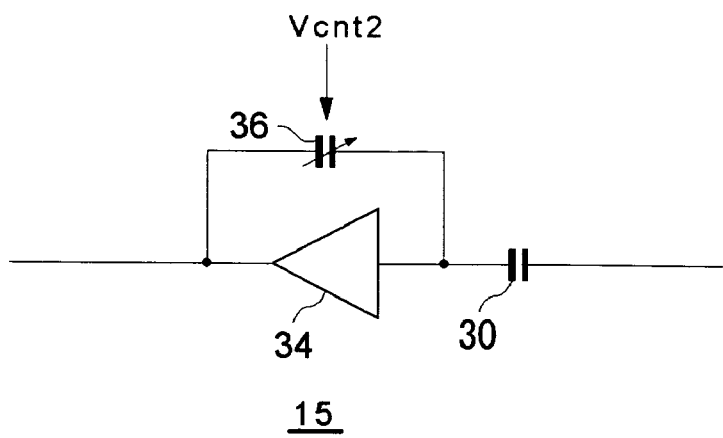
FIG. 5 is a circuit diagram showing a structure of a second amplifier circuit shown in FIG. 1.

A description will now be given of a structure where the gain of the second amplifier circuit 15 is controlled. FIG. 5 illustrates a structure of the second amplifier circuit 15 shown in FIG. 1. The second amplifier circuit 15 includes an operational amplifier 34, a first capacitor 30, and a second capacitor 36. The first capacitor 30 is provided near the input side of the operational amplifier 34, and the capacitance value thereof is fixed. The second capacitor 36 is provided between the input and output of the operational amplifier 34, and the capacitance value thereof is variable. The capacitance value of the second capacitor 36 is switched by the amplification control signal Vcnt2 outputted from the amplifier control circuit 19 shown in FIG. 1. If the capacitance value of the first capacitor 30 is denoted by C1 and that of the second capacitor 36 is denoted by C2, then the gain of the second amplifier circuit 15 will be C1/C2. Since in the first embodiment the gain of the second amplifier circuit 15 is switched between 4× and 8×, a structure is such that two different vales can be set as the capacitance value of the second capacitor 36. For example, the second capacitor 36 may be configured by two capacitors of equal capacitance value connected in parallel via a switch. In such a case, the amplification control signal Vcnt2 controls the ON and OFF of the switch to control the number of capacitor connections.

Figure 6:
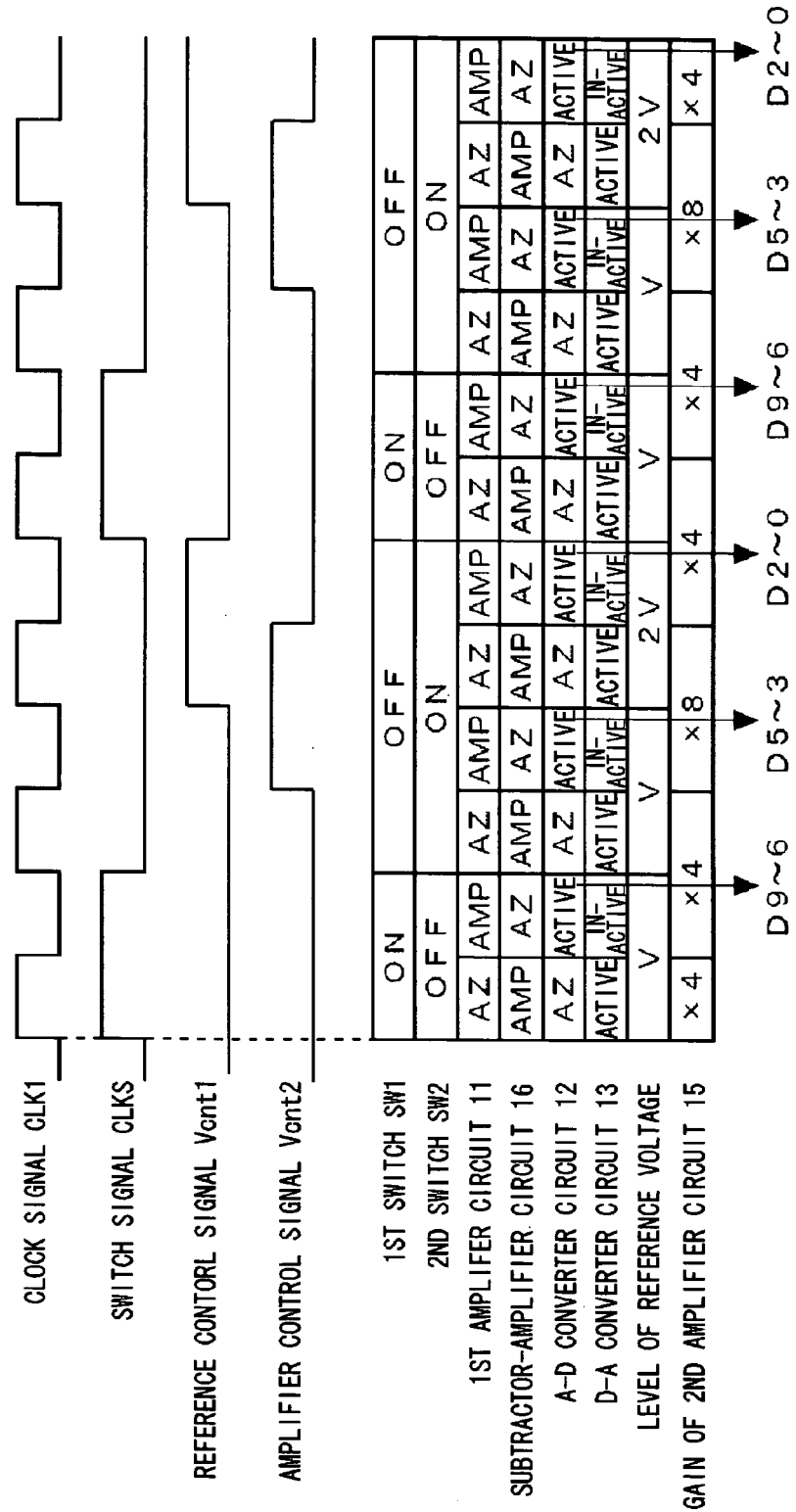
FIG. 6 is a timing chart illustrating an operation of the A-D converter shown in FIG. 1.

A description is given of an operation of the A-D converter 100 structured as above. FIG. 6 is a timing chart illustrating an operation of the A-D converter 100 shown in FIG. 1. The operation will be described starting from the top of FIG. 6 downward. Four waveforms from the top are a clock signal CLK1, a switch signal CLKS, a reference control signal Vcnt1, and an amplification control signal Vcnt2. The clock signal CLK1 controls the operations of the first amplifier circuit 11, the substractor-amplifier circuit 16, the A-D converter circuit 12 and the D-A converter circuit 13. The switch signal CLKS controls the ON and OFF of the first switch SW1 and the second switch SW2. The reference control signal Vcnt1 controls the range of reference voltage in the A-D converter circuit 12. The amplification control signal Vcnt2 controls the gain of the second amplifier circuit 15.

The first switch SW1 is turned on when the switch signal CLKS is in a high level, whereas it is turned off when the switch signal CLKS is in a low level. The second switch SW2 is turned on when the switch signal CLKS is in a low level, whereas it is turned off when the switch signal CLKS is in a high level.

When the clock signal CLK1 is in a low level, the first amplifier circuit 11 amplifiers an analog signal inputted and outputs the amplified signal to the subtraction circuit 14. When the clock signal CLK1 is in a high level, the first amplifier circuit 11 performs an autozero operation. The subtractor-amplifier circuit 16 amplifiers an analog signal inputted when the clock signal CLK1 is in a high level, and outputs the amplified signal to the first amplifier circuit 11 and the A-D converter circuit 12. When the clock signal CLK1 is in a low level, the subtractor-amplifier circuit 16 performs an autozero operation. When the clock signal CLK1 is in a low level, the A-D converter circuit 12 performs a conversion operation so as to output digital values, whereas when the clock signal CLK1 is in a high level, the A-D converter circuit 12 performs an autozero operation. When the clock signal CLK1 is in a high level, the D-A converter circuit 13 converts the output of the A-D converter circuit 12 into analog values, whereas when the clock signal CLK1 is in a low level, the D-A converter circuit 13 becomes indeterminate or inactive.

When the reference control signal Vcnt1 transits from a low level to a high level, the range of reference voltages, supplied to a plurality of comparator circuits that constitute the A-D converter circuit 12, becomes doubled. When the reference control signal Vcnt1 transits from a high level to a low level, the range of reference voltages returns to the original range. When the amplification control signal Vcnt2 transits from a low level to a high level, the gain of the second amplifier circuit 15 increases from 4× to 8×. When the amplification control signal Vcnt2 transits from a high level to a low level, the gain of the second amplifier circuit 15 decreases from 8× to 4×.

According to the first embodiment, the reference voltage control circuit 17 performs a control in a manner such that the range of reference voltages in the A-D converter circuit 12 at the time of conversion in the third step, namely, converting to the least significant bit is larger than the range of reference voltages in the A-D converter circuit 12 at the time of conversion in the first and the second step conducted prior to converting to the least significant bit. Thus, the influence due to the offset of comparator circuits included in the A-D converter circuit 12 can be reduced. The degree of precision in conversion to the least significant bit which directly affects the degree of accuracy in the A-D converter 100 as a whole can be raised, and the degree of accuracy in the A-D converter 100 can be effectively improved.

Also, the reference voltage control circuit 17 performs a control in a manner such that the range of reference voltages in the A-D converter circuit 12 at the time of conversion in the first and the second step is smaller than the range of reference voltages in the A-D converter circuit 12 at the time of conversion in the third step, namely, converting to the least significant bit. Thus, the degree of accuracy in the A-D converter 100 can be improved and at the same time the unnecessary power consumption can be cut down. That is, the present embodiment can balance the improvement of the conversion accuracy and the reduction of power consumption.

Modification to the First Embodiment

Figure 7:
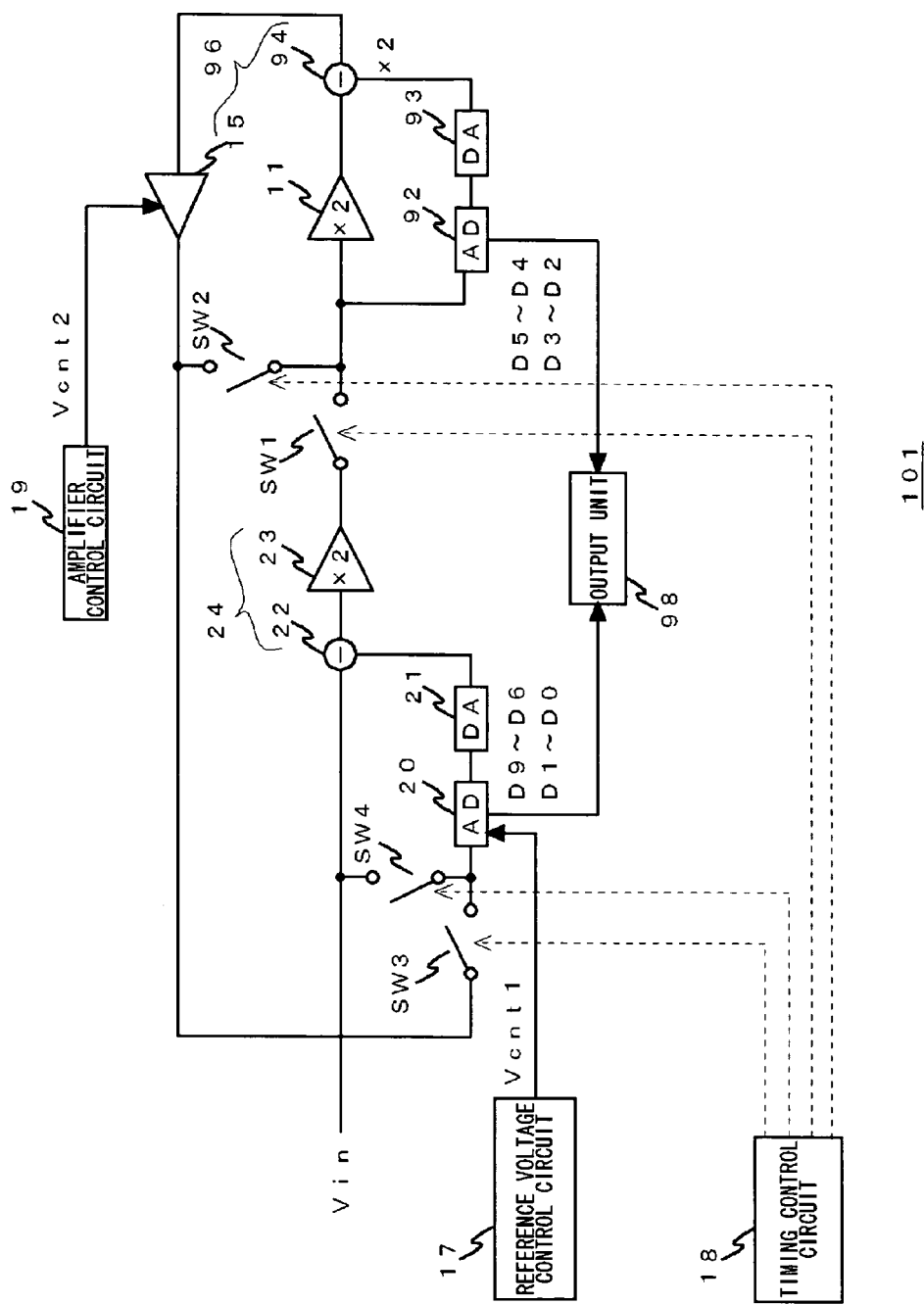
FIG. 7 illustrates a structure of an A-D converter according to a modification of the first embodiment.

FIG. 7 illustrates a structure of an A-D converter 101 according to a modification of the first embodiment. In FIG. 7, components identical to those in FIG. 1 are given the same reference numerals as in FIG. 1 and the explanation thereof are omitted as appropriate. The structure of the A-D converter 101 shown in FIG. 7 is such that a circuit for outputting higher 4 bits (D9 to D6) and lower 2 bits (D0 and D1) is added anterior to the cyclic-type A-D converter 100 shown in FIG. 1. As a result, the operation of the A-D converter 101 can be faster.

In addition to the components of the A-D converter 100 shown in FIG. 1, the A-D converter 101 is comprised of a third switch SW3, a fourth switch SW4, a second A-D converter circuit 20, a second D-A converter circuit 21, a second subtraction circuit 22, and a third amplifier circuit 23. In the A-D converter 101, the analog signal Vin is inputted to the second A-D converter circuit 20 via the fourth switch SW4. The second A-D converter circuit 20 converts the inputted analog signal into a digital value of maximum 4 bits so as to be outputted to the second D-A converter circuit 21. The second D-A converter circuit 21 converts the digital value of maximum 4 bits, which has been outputted from the second A-D converter circuit 20, into an analog signal.

The second subtraction circuit 22 subtracts the output of the second D-A converter circuit 21 from the analog signal Vin. The third amplifier circuit 23 amplifies the output of the second subtraction circuit 22. The output of the third amplification circuit 23 is outputted to the first amplifier circuit 11 and the first A-D converter circuit 92 via the first switch SW1. The gain of the third amplifier circuit 23 is 2×. Note that a subtractor-amplifier circuit 24 which is an amplifier circuit having a subtraction function may be used instead of the second subtraction circuit 22 and the third amplifier circuit 23. Also, a sample-and-hold circuit may be inserted anterior to the second subtraction circuit 22. In the example of FIG. 7, the subtraction is performed by adjusting the timing of input to the second subtractor-amplifier circuit 24.

The first A-D converter circuit 92 converts the inputted analog signal to a digital signal of maximum 2 bits and then outputs the digital signal to the first D-A converter circuit 93. The first D-A converter circuit 93 converts the digital value of maximum 2 bits outputted from the first A-D converter circuit 92, into an analog signal. Here, the analog value outputted from the first D-A converter circuit 93 is amplified by a factor of 2 in accordance with the gain of the first amplifier circuit 11.

The first amplifier circuit 11 samples the inputted analog signal and holds it, and then amplifies it by a factor of 2 and outputs the amplified signal to the first subtraction circuit 94. The first subtraction circuit 94 subtracts the analog value outputted from the first D-A converter circuit 93 from the analog value outputted from the first amplifier circuit 11. The second amplifier circuit 15 amplifies the output of the first subtraction circuit 94. The gain of the second amplifier circuit 15 is controlled by the amplification control signal Vcnt2 outputted from the amplifier control circuit 19. The output of the second amplifier circuit 15 is fed back to the first amplifier circuit 11 and the first A-D converter circuit 92 via the second switch SW2. Or, the output of the second amplifier circuit 15 is fed back to the second A-D converter 20 via the third switch SW3. Note that a subtractor-amplifier circuit 96 which is an amplifier circuit having a subtraction function may be used instead of the first subtraction circuit 94 and the second amplifier circuit 15.

In the first step, which is the initial step of conversion, the fourth switch SW4 is turned on and the third switch SW3 is turned off. In the first step, the second A-D converter circuit 20 generates values of the higher 1st to 4th bits (D9 to D6) among the digital values of 10 bits that the A-D converter 101 will output finally. In the second step, the first switch SW1 is turned on and the second switch SW2 is turned off. In the second step, the first A-D converter circuit 92 generates values of the higher 5th and 6th bits (D5 and D4) among the digital values of 10 bits that the A-D converter 101 will output finally. In the third step, the second switch SW2 is turned on and the first switch SW1 is turned off. In the third step, the first A-D converter circuit 92 generates values of the higher 7th and 8th bits (D3 and D2) among the digital values of 10 bits that the A-D converter 101 will output finally. In the fourth step, the third switch SW3 is turned on and the fourth switch SW4 is turned off. In the fourth step, the second A-D converter circuit 20 generates values of the higher 9th and 10th bits (D1 and D0) among the digital values of 10 bits that the A-D converter 101 will output finally.

The digital values (D9 to D6, D5 and D4, D3 and D2, D1 and D0) sequentially outputted from the first A-D converter 92 and the second A-D converter 20 are inputted to the output unit 98. The output unit 98 performs correction based on the redundancy range, described later, on the inputted digital values. The output unit 98 outputs the corrected digital values parallely.

The redundancy ranges are provided in the conversion by the first A-D converter circuit 92 in the second and the third step and the conversion by the second A-D converter circuit 20 in the fourth step. Thus, it is possible that the result of conversion in the first to the third step is corrected by the result of conversion by the A-D converter in the second to the fourth step.

The reference voltage control circuit 17 performs a control in a manner that the range of reference voltages in the second A-D converter circuit 20 at the time of conversion in the fourth step, namely, converting to the least significant bit is double the range of reference voltages in the second A-D converter circuit 20 at the time of conversion in the first step.

A structure by which to control the range of reference voltages in the second A-D converter circuit 20 may be the exemplary structure explained in FIG. 2 to FIG. 4B. The timing control circuit 18 controls the ON and OFF of the first switch SW1 to the fourth switch SW4. Similar to the example described with reference to FIG. 5, the amplifier control circuit 19 controls the gain of the second amplifier circuit 15.

Figure 8:
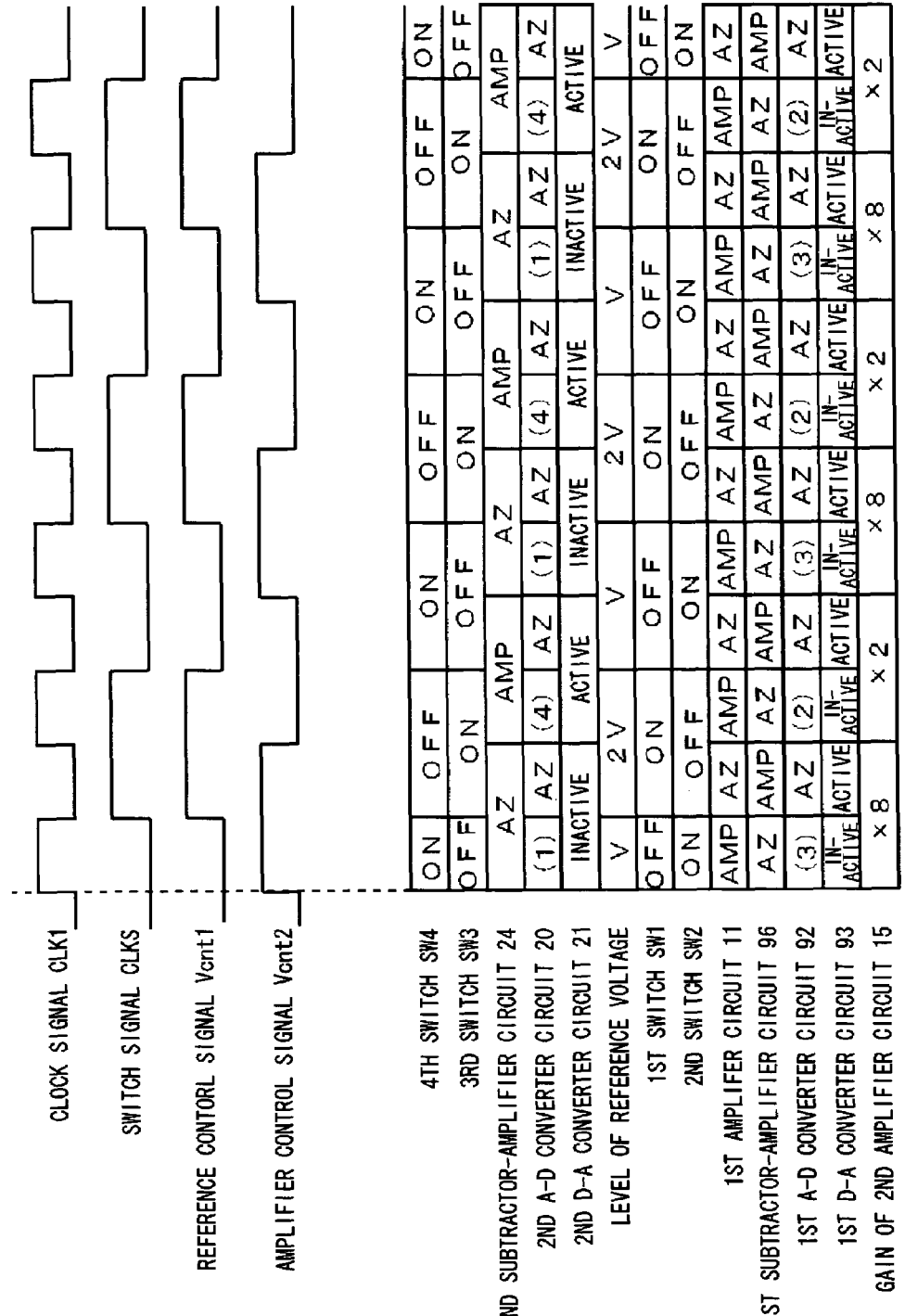
FIG. 8 is a timing chart illustrating an operation of the A-D converter shown in FIG. 7.

A description is given of an operation of the A-D converter structured as above. FIG. 8 is a timing chart illustrating an operation of the A-D converter 101 shown in FIG. 7. The operation will be described starting from the top of FIG. 8 downward. Four waveforms from the top are a clock signal CLK1, a switch signal CLKS, a reference control signal Vcnt1, and an amplification control signal Vcnt2. The clock signal CLK1 controls the operations of the first amplifier circuit 11, the first substractor-amplifier circuit 96, the first A-D converter circuit 92, the first D-A converter circuit 93, the second subtractor-amplifier circuit 24, the second A-D converter circuit 20, and the second D-A converter circuit 21. The switch signal CLKS controls the ON and OFF of the first switch SW1 to the fourth switch SW4. The reference control signal Vcnt1 controls the range of reference voltages in the second A-D converter circuit 20. The amplification control signal Vcnt2 controls the gain of the second amplifier circuit 15.

The first switch SW1 and the third switch SW3 are turned on when the switch signal CLKS is in a high level, whereas they are turned off when the switch signal CLKS is in a low level. The second switch SW2 and the fourth switch SW4 are turned on when the switch signal CLKS is in a low level, whereas they are turned off when the switch signal CLKS is in a high level.

Every time the clock signal CLK1 transits from a low level to a high level, the operation of amplifying the inputted analog signal and the autozero operation are switched therebetweeen in the second subtractor-amplifier circuit 24. The second A-D converter circuit 20 carries out a conversion operation and then outputs a digital value when the clock signal CLK1 is high, whereas it carries out an autozero operation when the clock signal CLK1 is low. When the reference control signal Vcnt1 transits from a low level to a high level, the range of reference voltages, supplied to a plurality of comparator circuits that constitute the second converter circuit 20, becomes doubled. When the reference control signal Vcnt1 transits from a high level to a low level, the range of reference voltages returns to the original range. Every time the clock signal CLK1 transits from a low level to a high level, the state in which the D-A conversion is executed and the indeterminate (inactive) state are switched therebetweeen in the second D-A converter circuit 21.

When the clock signal CLK1 is in a high level, the first amplifier circuit 11 amplifies an inputted analog signal and then outputs it to the first subtraction circuit 94. When the clock signal CLK1 is in a low level, the first amplifier circuit 11 performs an autozero operation. When the clock signal CLK1 is in a low level, the first subtractor-amplifier circuit 96 amplifiers the analog signal inputted. When the clock signal CLK1 is in a high level, the first subtractor-amplifier circuit 96 performs an autozero operation. When the amplification control signal Vcnt2 transits from a low level to a high level, the gain of the second amplifier circuit 15 of the first subtractor-amplifier circuit 96 increases from 2× to 8×. And when the amplification control signal Vcnt2 transits from a high level to a low level, it decreases from 8× to 2×. When the clock signal CLK1 is in a high level, the first A-D converter circuit 92 performs a conversion operation so as to output a digital value, whereas the clock signal CLK1 is in a low level, the first A-D converter circuit 92 performs an autozero operation. When the clock signal CLK1 is in a low level, the first D-A converter circuit 93 performs a D-A conversion, whereas when the clock signal CLK1 is in a high level, the first D-A converter circuit 93 becomes indeterminate or inactive.

This modification also can achieve the same advantageous effects as with the first embodiment. Moreover, by employing this modification, the A-D converter 101 is structured such that a stage, in which the higher 4 bits (D9 to D6) and the 2 least significant bits, is additionally provided anterior to a cyclic-type A-D converter. As a result, the conversion rate can be increased.

Second Embodiment

In the first embodiment, a description has been given of a structure in which the range of reference voltages in the A-D converter circuit at the time of converting to the least significant bit is enlarged so as to raise the degree of accuracy of conversion to the least significant bit. In a second embodiment, the A-D converter circuit is configured to be operable by a first mode and a second mode. In the first mode, an input analog signal is sampled at the end of a non-operating period and the reference voltage is received during a comparative operating period. In the second mode, a reference voltage is sampled at the end of a non-operating period and the input analog signal is received during a comparative operating period. Then at the time of converting to the least significant bit the A-D converter circuit is operated in the first mode having a higher conversion accuracy. Thereby, the degree of freedom in designing an A-D converter circuit is increased and at the same time the degree of accuracy of conversion to the least significant bit can be raised.

Figure 9:
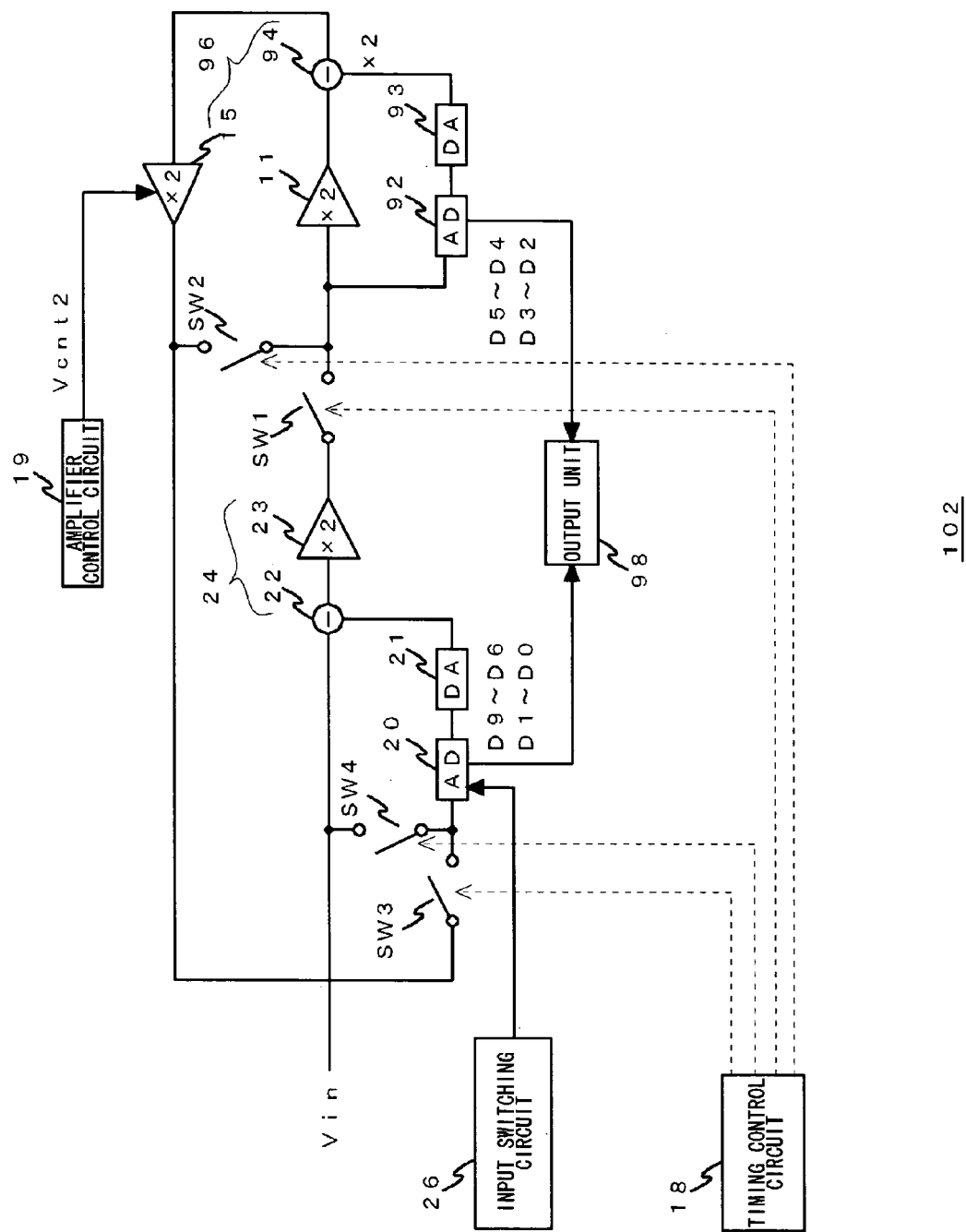
FIG. 9 illustrates a structure of an A-D converter according to a second embodiment of the present invention.

FIG. 9 illustrates a structure of an A-D converter 102 according to the second embodiment. In FIG. 9, components identical to those in FIG. 7 are given the same reference numerals as in FIG. 7 and the explanation thereof are omitted as appropriate. The A-D converter 102 shown in FIG. 9 differs from the A-D converter 101 shown in FIG. 7 in that in place of or in addition to the reference voltage control circuit 17 shown in FIG. 7 there is provided an input switching circuit 26 which switches a signal inputted to a second A-D converter circuit 20. Further, an amplifier control circuit 19 controls the gain of a second amplifier circuit 15 according as the second amplifier circuit 15 feeds the output thereof back to a first A-D converter circuit 92 or a second A-D converter 20. More specifically, if the second amplifier circuit 15 feeds back the output thereof to the first A-D converter 92, the amplifier control circuit 19 will perform a control so that the gain of the second amplifier circuit 15 is 2×. If, on the other hand, the second amplifier circuit 15 feeds back the output thereof to the second A-D converter 20, the amplifier control circuit 19 will perform a control so that the gain of the second amplifier circuit 15 is 4×.

Figure 10:
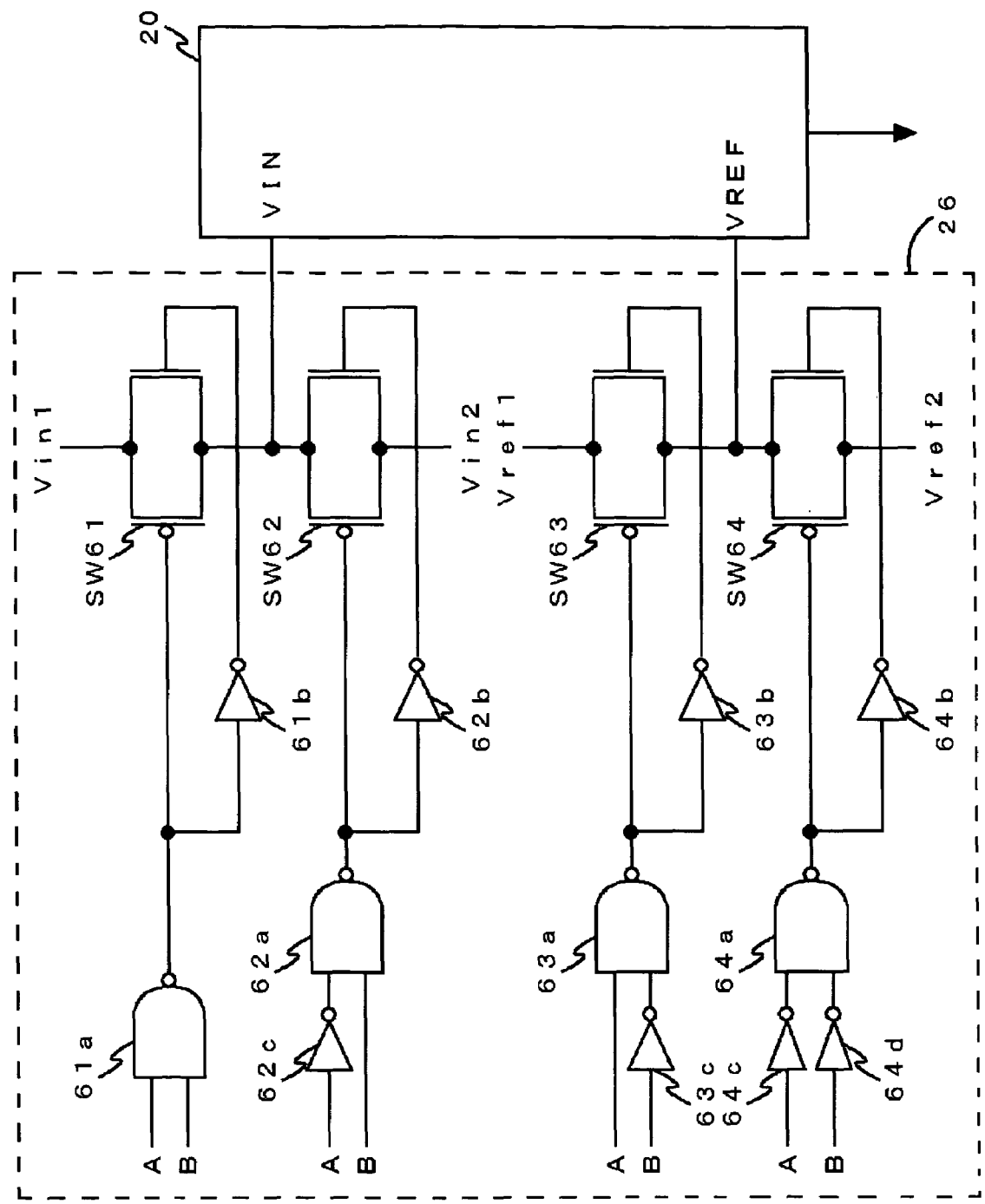
FIG. 10 illustrates a first configuration example of an input switching circuit.

A description will now be given of the switching control by the input switching circuit 26. FIG. 10 illustrates a first configuration example of the input switching circuit 26. In the input switching circuit 26, four kinds of voltages are inputted to an VIN input terminal and a VREF terminal of the second A-D converter circuit 20, respectively. The input switching circuit 26 is provided with four switches SW61 to SW64. The switch SW61 for Vin1 is a switch used to turn on and off the input of the input analog signal Vin1 to the VIN terminal, and the switch SW61 is provided with a NOT circuit 61b where the logic is inverted. The switch SW62 for Vin2 is a switch used to turn on and off the input of the input analog signal Vin2 to the VIN terminal, and the switch SW62 is provided with a NOT circuit 62b where the logic is inverted. The switch SW63 for Vref1 is a switch used to turn on and off the input of the first reference voltage Vref1 to the VREF terminal, and the switch SW63 is provided with a NOT circuit 63b where the logic is inverted. The switch SW64 for Vref2 is a switch used to turn on and off the input of the second reference voltage Vref2 to the VREF terminal, and the switch SW64 is provided with a NOT circuit 64b where the logic is inverted.

A NAND circuit 61a is connected with the switch SW61 for Vin1. A NAND circuit 62a is connected with the switch SW62 for Vin2, and a NOT circuit 62c is connected to a terminal to which a signal A of the NAND circuit 62a is inputted. A NAND circuit 63a is connected with the switch SW63 for Vref1, and a NOT circuit 63c is connected to a terminal to which a signal B of the NAND circuit 63a is inputted. A NAND circuit 64a is connected with the switch SW64 for Vref2, and a NOT circuit 64c and a NOT circuit 64d are connected to both terminals of the NAND circuit 64a.

Figure 11:
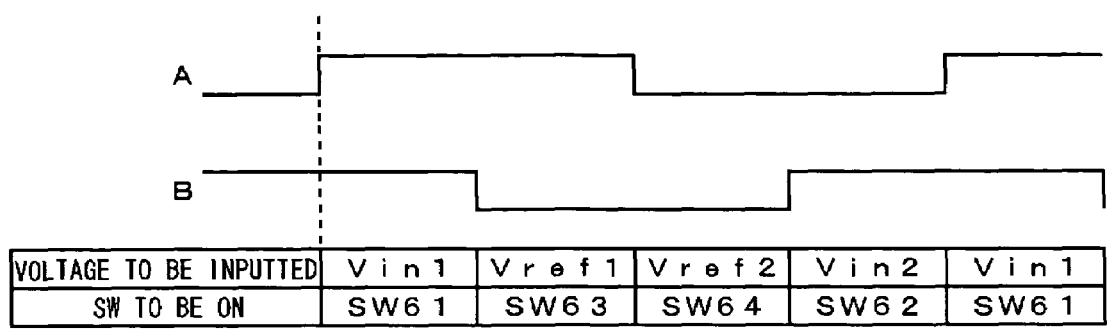
FIG. 11 illustrates a control signal in the first configuration example of an input switching circuit.

FIG. 11 illustrates a control signal in a first configuration example of the input switching circuit 26. When the signal A is high and the signal B is high, the Vin1 switch SW61 alone is turned on, and the input analog signal Vin1 is inputted to the VIN terminal. When the signal A is high and the signal B is low, the Vref1 switch SW63 alone is turned on, and the first reference voltage Vref1 is inputted to the VREF terminal. When the signal A is low and the signal B is low, the Vref2 switch SW64 alone is turned on, and the second reference voltage Vref2 is inputted to the VREF terminal. When the signal A is low and the signal B is high, the Vin2 switch SW62 alone is turned on, and the input analog signal Vin2 is inputted to the VIN terminal. Then the input switching circuit 26 has the second A-D converter circuit 20 receive the input of four kinds of voltages in this order as described above.

Figure 12:
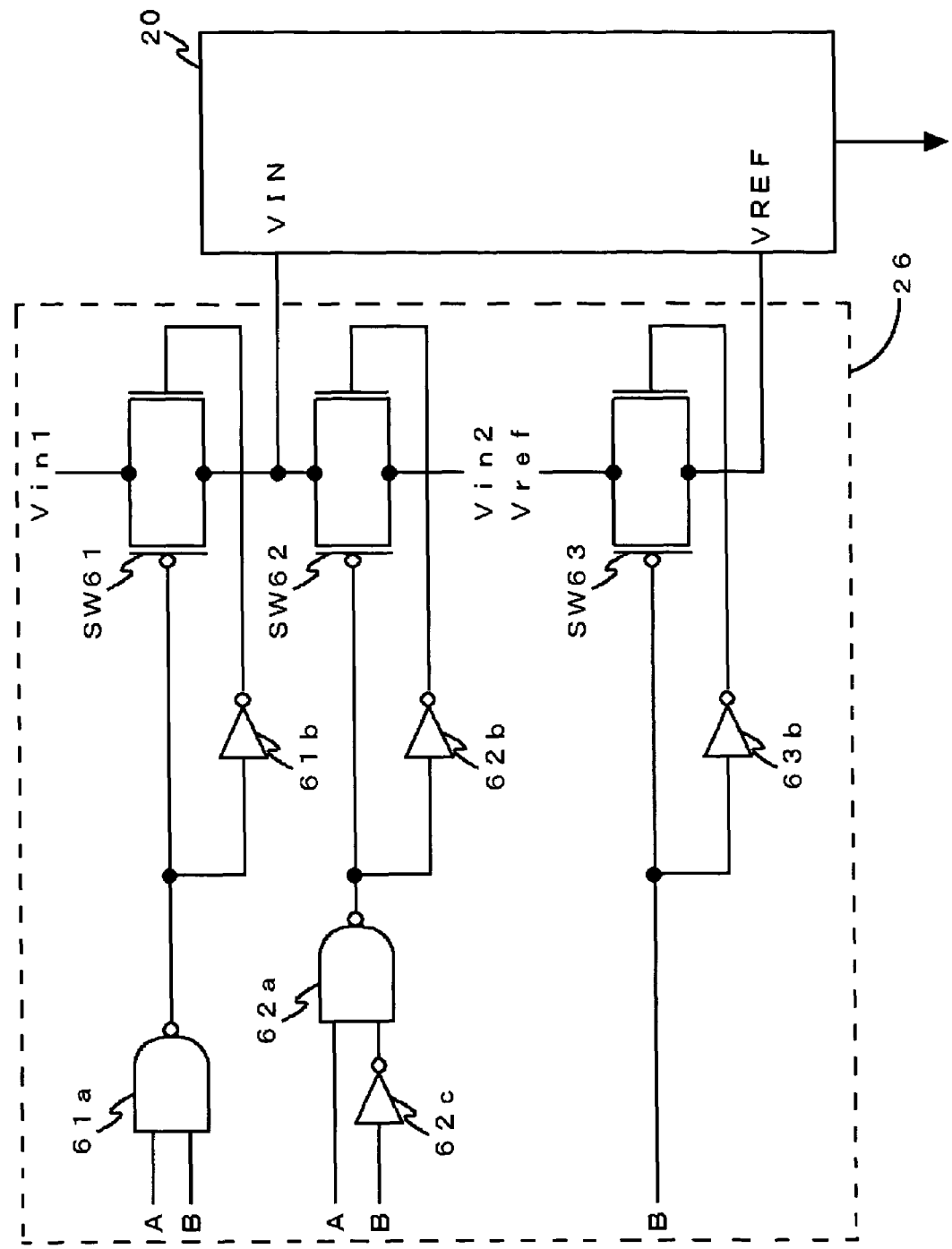
FIG. 12 illustrates a second configuration example of an input switching circuit.

Next, a description will be given of another switching control by the input switching circuit 26. This example represents a case where there is a single kind of reference voltage reference Vref. If the gain of the second amplifier circuit 15 is 4×, the same reference voltage Vref can be used in the case of converting the higher 4 bits (D9 to D6) and the least significant 2 bits (D1 and D0). FIG. 12 illustrates a second configuration example of the input switching circuit 26. In the input switching circuit 26, three kinds of voltages are inputted to a VIN input terminal and a VREF terminal of the second A-D converter circuit 20, respectively. The input switching circuit 26 is provided with three switches SW61 to SW63. The switch SW61 for Vin1 is a switch used to turn on and off the input of the input analog signal Vin1 to the VIN terminal, and the switch SW61 is provided with a NOT circuit 61b where the logic is inverted. The switch SW62 for Vin2 is a switch used to turn on and off the input of the input analog signal Vin2 to the VIN terminal, and the switch SW62 is provided with a NOT circuit 62b where the logic is inverted. The switch SW63 for Vref is a switch used to turn on and off the input of the reference voltage Vref to the VREF terminal, and the switch SW63 is provided with a NOT circuit 63b where the logic is inverted.

A NAND circuit 61a is connected with the switch 61 for Vin1. A NAND circuit 62a is connected with the switch SW62 for Vin2, and a NOT circuit 62 is connected to a terminal to which a signal B of the NAND circuit 62a is inputted. The inverted output of the signal B is inputted to the switch SW63 for Vref.

Figure 13:
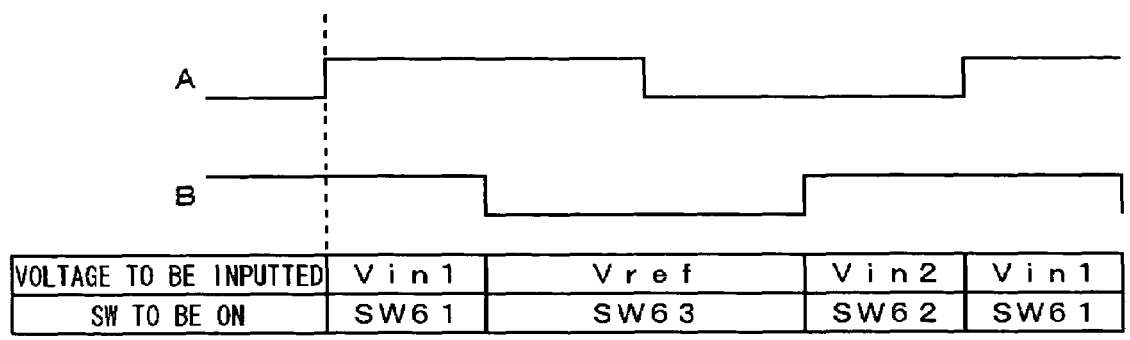
FIG. 13 illustrates a control signal in the second configuration example of an input switching circuit.

FIG. 13 illustrates a control signal in the second configuration example of the input switching circuit 26. When the signal A is high and the signal B is high, the Vin1 switch SW61 alone is turned on, and the input analog signal Vin1 is inputted to the VIN terminal. When the signal A is high and the signal B is low as well as when the signal A is low and the signal B is low, the Vref switch SW63 alone is turned on, and the reference voltage Vref is inputted to the VREF terminal. When the signal A is low and the signal B is high, the Vin2 switch SW62 alone is turned on, and the input analog signal Vin2 is inputted to the VIN terminal. Then the input switching circuit 26 has the second A-D converter circuit 20 receive the input of three kinds of voltages in this order as described above.

FIG. 14 illustrates a temporal change in signal inputted to the second A-D converter circuit 20 shown in FIG. 9. When the conversion to the higher 4 bits (D9 to D6) is performed, the reference voltage Vref is inputted to the second A-D converter circuit 20 during an autozero operation period and the analog signal Vin to be converted is inputted thereto during a conversion operation period. When, on the other hand, the conversion to the least significant 2 bits (D1 and D0) is performed, the analog signal Vin to be converted is inputted to the second A-D converter circuit 20 during an autozero operation period and the reference voltage Vref is inputted thereto during a conversion operation period. That is, at the time of converting to the higher 4 bits (D9 to D6), the second A-D converter circuit 20 operates under the second mode, whereas at the time of converting to the lease significant 2 bits (D1 and D0), the second A-D converter circuit 20 operations under the first mode. The timing at which the analog signal or reference voltage is inputted to the second A-D converter circuit 20 is controlled by the input switching circuit 26.

According to the second embodiment, the input switching circuit 26 is so provided that the second A-D converter circuit 20 is operable under the first and the second mode. Thereby, the degree of freedom in designing the A-D converter 102 is increased. Also, with the control by the input switching circuit 26, the operation mode of the second A-D converter circuit 20 at the time of converting to the least significant bit is switched from the second mode to the first mode. Thereby, when converting to the lease significant bit, the second A-D converter circuit 20 receives the input of a reference voltage, having less variation than that in the input analog signal, during a comparative operating period. Thus, the degree of accuracy of conversion to the least significant bit can be raised.

Third Embodiment

In the first embodiment, a description has been given of an example where the range of reference voltages in the A-D converter circuit at the time of converting to the least significant bit is enlarged so as to raise the degree of accuracy of conversion to the least significant bit. In a third embodiment, a description will be given of an example where the degree of accuracy of conversion to the least significant bit is raised by controlling the current supplied to comparators of an A-D converter circuit at the time of converting to the least significant bit.

Figure 15:
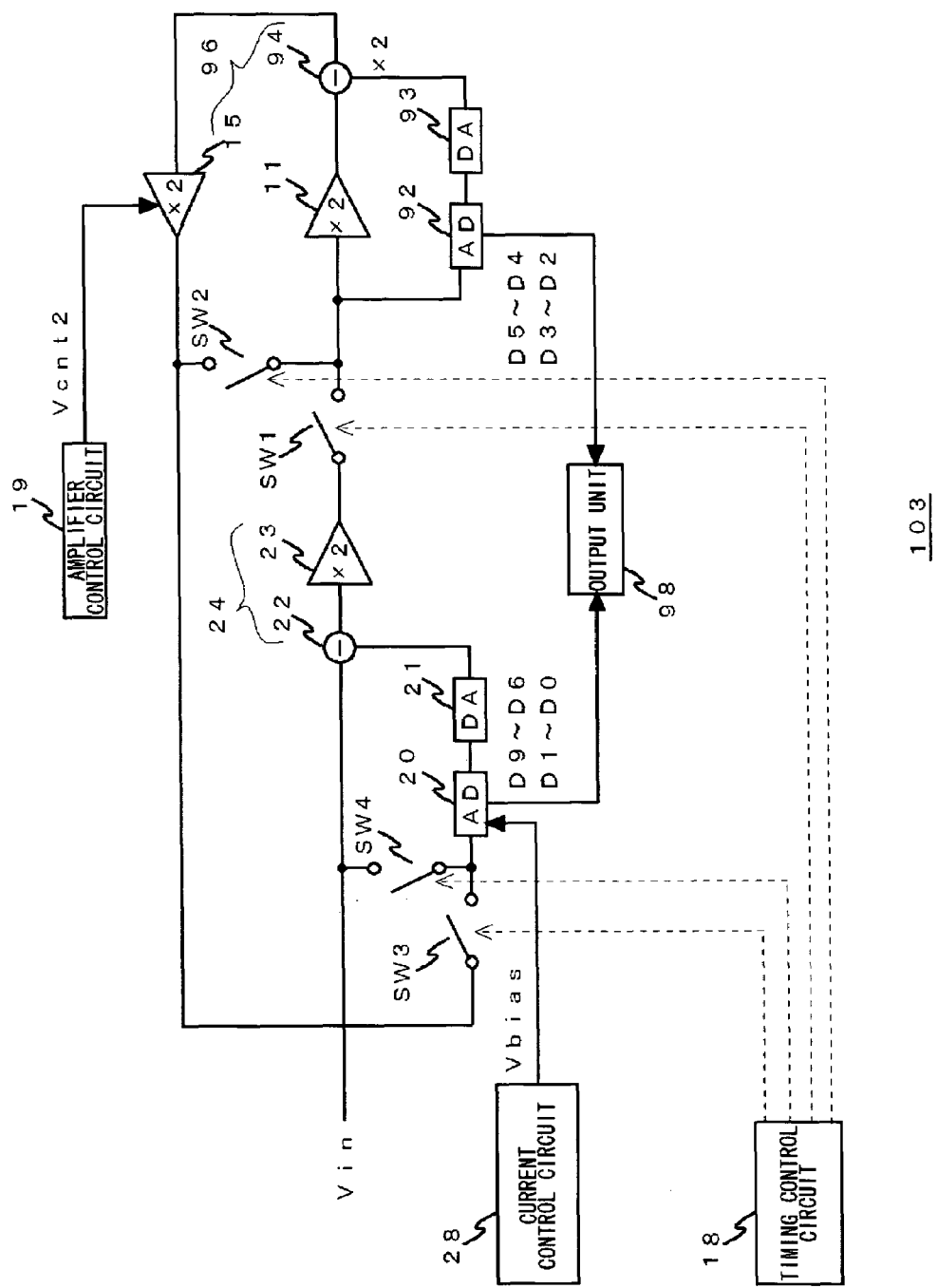
FIG. 15 illustrates a structure of an A-D converter according to a third embodiment of the present invention.

FIG. 15 illustrates a structure of an A-D converter 103 according to the third embodiment. In FIG. 15, components identical to those in FIG. 7 or FIG. 9 are given the same reference numerals as in FIG. 7 and FIG. 9 and the explanation thereof are omitted as appropriate. The A-D converter 102 shown in FIG. 15 differs from the A-D converter 101 shown in FIG. 7 and the A-D converter shown 102 in FIG. 9 in that in place of or in addition to the reference voltage control circuit 17 shown in FIG. 7 and the input switching circuit 26 shown in FIG. 9 there is provided a current control circuit 28 which controls, by a current control signal Vbias, the level of current supplied to the comparators of the second A-D converter circuit 20.

Figure 16:
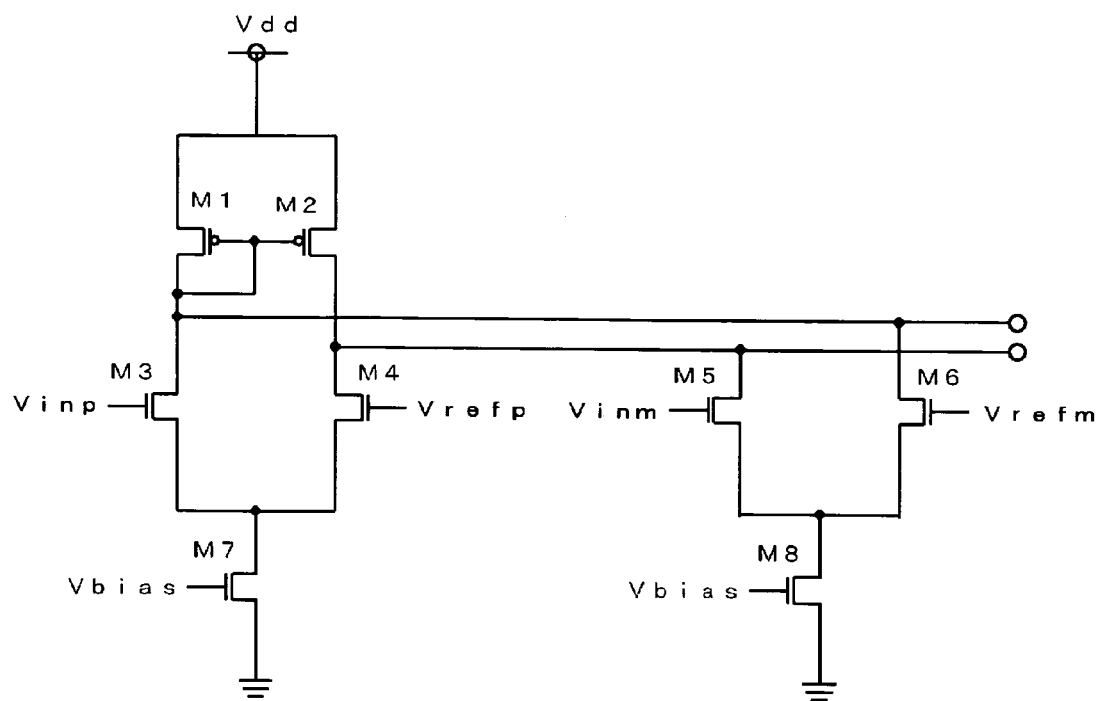
FIG. 16 illustrates a structure of a comparator contained in the second A-D converter circuit shown in FIG. 15.

FIG. 16 illustrates a structure of a comparator contained in the second A-D converter circuit 20 shown in FIG. 15. Only the differential amplifier part of a comparator is shown in FIG. 16, and components located posterior to the differential amplifier is omitted. The comparator contained in the second A-D converter 20 includes a first transistor M1 to an eighth transistor M8. The first transistor M1 and the second transistor M2 are MOSFETs (Metal Oxide Semiconductor Filed Effect Transistors) of P channel type. The third transistor M3 to the eighth transistor M8 are MOSFETs of N channel type.

The source of the first transistor M1 and the source of the second transistor M2 are connected with a power supply line. The gate of the first transistor M1 as a control terminal and the gate of the second transistor M2 as a control terminal are connected with the drain of the first transistor M1. That is, the first transistor M1 and the second transistor M2 constitute a current-mirror circuit. The drain of the first transistor M1 is connected with the drain of the third transistor M3 and the drain of the sixth transistor M6. The drain of the second transistor M2 is connected with the drain of the fourth transistor M4 and the drain of the fifth transistor M5. The source of the third transistor M3 and the source of the fourth transistor M4 are connected to ground by way of the seventh transistor M7. The source of the fifth transistor M5 and the source of the sixth transistor M6 are connected to ground by way of the eighth transistor M8.

Bias voltages Vbias are inputted respectively to the gates of the seventh transistor M7 and the eighth transistor M8 serving as control terminals. The bias voltage Vbias is supplied from the current control circuit 28. The seventh transistor M7 and the eighth transistor M8 each operate as a constant-current source. A positive-phase portion of an analog signal (denoted by Vinp) is inputted to the gate of the third transistor M3 serving as a control terminal. A positive-phase portion of a reference voltage (denoted by Vrefp) is inputted to the gate of the fourth transistor M4 serving as a control terminal. A reversed-phase portion of the analog signal (denoted by Vinm) is inputted to the gate of the fifth transistor M5 serving as a control terminal. A reversed-phase portion of the reference voltage (denoted by Vrefm) is inputted to the gate of the sixth transistor M6 serving as a control terminal. The voltages at the drains of the fourth transistor M4 and the fifth transistor M5 are the output in the positive-phase side. The voltages at the drains of the third transistor M3 and the sixth transistor M6 are the output in the inversed-phase side.

A description will now be given of a control by the current control circuit 28. FIG. 17 illustrates a temporal change in bias voltage Vbias which the current control circuit of FIG. 15 inputs to a comparator of FIG. 16. At the time of conversion to the higher 4 bits (D9 to D6), the current control circuit 28 supplies a small bias voltage to a comparator of FIG. 16. On the other hand, at the time of conversion to the least significant 2 bits (D1 and D0), the current control circuit 28 supplies a large bias voltage to a comparator of FIG. 16. Thereby, the current supplied to the comparator at the time of conversion to the least significant 2 bits (D1 and D0) is larger than the current supplied to the comparator at the time of conversion to the higher 4 bits (D9 to D6). Thereby, the speed of comparison operation in the comparator at the time of conversion to the least significant bit is raised. As a result, the risk of determining the output of a comparator before the output of the comparator reaches a sufficient level is reduced and therefore the degree of accuracy of conversion to the least significant bit is raised. The control in which the current supplied to the comparator at the time of conversion to the least significant bit is increased is particularly effective in the case where the difference between the analog signal and the reference voltage is often small.

Contrary to the case of FIG. 17, the current control circuit 28 may perform a control in a manner that the current supplied to the comparator at the time of conversion to the least significant 2 bits (D1 and D0) is smaller than the current supplied to the comparator at the time of conversion to the higher 4 bits (D9 to D6). In this case, the gate voltage Vbias of the seventh transistor M7 and the eighth transistor M8 is set to a smaller value. Thus, even when the voltage between the drain and the source is small, the seventh transistor M7 and the eighth transistor M8 operate in saturation region. Therefore, the range in which the output voltage of the comparator can take is broadened. Thereby, the degree of accuracy of conversion to the least significant bit is raised. The control in which the current supplied to the comparator at the time of conversion to the least significant bit is made small is particularly effective in the case where the common potential of analog signal differs from the common potential of reference voltage. Here, the common potential is the average value of positive-phase-side potential and reversed-phase-side potential. If the common potential of analog signal differs from the common potential of reference voltage, both the positive-phase side and the reversed-phase side will become larger or smaller with time. Then the gain falls and it becomes difficult to determine the output of the comparator if the range of values that the output voltage may take is narrow. In such a case, the evaluation accuracy of the output of the comparator can be raised by performing a control so that the current supplied to the comparator is small.

Fourth Embodiment

In a fourth embodiment, an A-D converter circuit is configured to be operable such that the switching is made between a mode where analog signal and a reference voltage are fixedly inputted to a comparator, included in the A-D converter, without involving a capacitor (hereinafter referred to as "gate-input type") and a mode where either of the analog signal and the reference voltage is selectively inputted to the comparator, included in the A-D converter, via a capacitor (hereinafter referred to as "capacitance-input type"). Then the type of the A-D converter circuit at the time of converting to the least significant bit is switched to the capacitance-input type, so that the accuracy of conversion to the least significant bit is raised.

Figure 18:
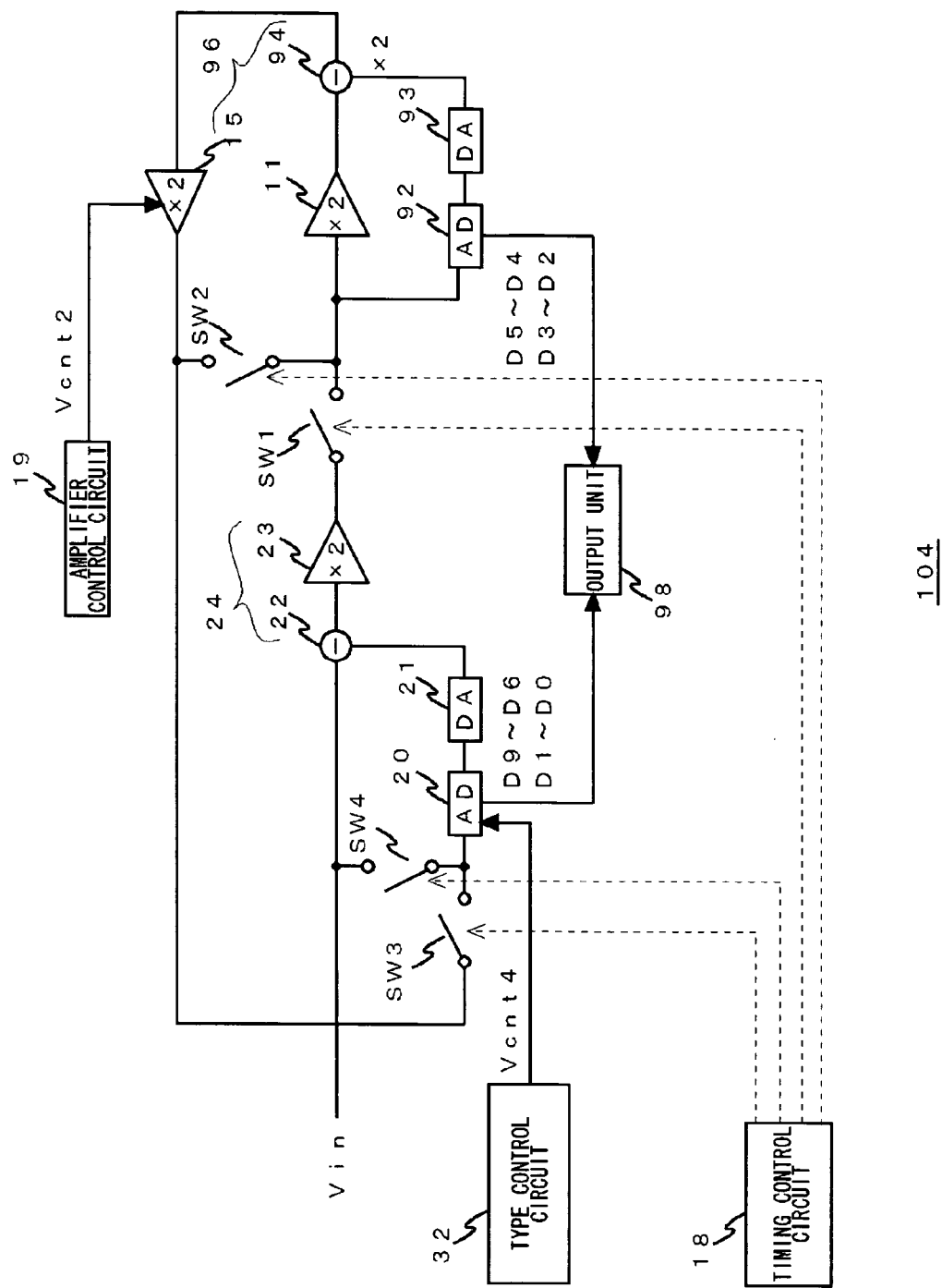
FIG. 18 illustrates a structure of an A-D converter according to a fourth embodiment of the present invention.

FIG. 18 illustrates a structure of an A-D converter 104 according to the fourth embodiment. In FIG. 18, components identical to those in FIG. 7, FIG. 9 or FIG. 15 are given the same reference numerals as in FIG. 7, FIG. 9 or FIG. 19 and the explanation thereof are omitted as appropriate. The A-D converter 102 shown in FIG. 18 differs from the A-D converter 101 shown in FIG. 7, the A-D converter 102 shown in FIG. 9 and the A-D converter 102 shown in FIG. 15 in that in place of or in addition to the reference voltage control circuit 17 of FIG. 7, the input switching circuit 26 of FIG. 9 and the current control circuit 28 of FIG. 15 there is provided a type control unit 32 which controls the type of the second A-D converter circuit 20 by a type control signal Vcnt4.

FIG. 19 illustrates a temporal change in the operation type of the second A-D converter circuit 20 shown in FIG. 18. The type control unit 32 of FIG. 18 performs a control in a manner that the type of the second A-D converter circuit 20 at the time of conversion to the higher 4 bits (D9 to D6) is set to the gate-input type and the type of the second A-D converter circuit 20 at the time of conversion to the least significant 2 bits (D1 and D0) is set to the capacitance-input type. Setting the type of the second A-D converter circuit 20 at the time of conversion to the least significant 2 bits (D1 and D0) to the capacitance-input type reduces the effect due to the variation in the analog signal Vin. This is so because in the case of the capacitance-input type the analog signal can be sampled at the ON-OFF timing of a switch as will be described later. Setting the type of the second A-D converter circuit 20 at the time of conversion to the higher 4 bits (D9 to D6) to the gate-input type eliminates the operation of an amplifier that drives the capacitance, so that the power consumption can be suppressed.

In the case of the gate-input type, a comparator used in the A-D converter circuit may be configured as shown in FIG. 16. Hereinbelow, the comparator having a structure as shown in FIG. 16 will be referred to as "four-input comparator". A comparator in which the fifth transistor M5, the sixth transistor M6 and the eighth transistor M8 are excluded from the structure shown in FIG. 16 (this comparator will be hereinafter referred to as "two-input comparator") may be used as a comparator used for the A-D converter circuit in the case of the capacitance-input type. Alternatively, the comparator may be configured and used in a manner such that the fifth transistor M5, the sixth transistor M6 and the eighth transistor M8 are set inactive in the four-input comparator of FIG. 16.

Figure 20:
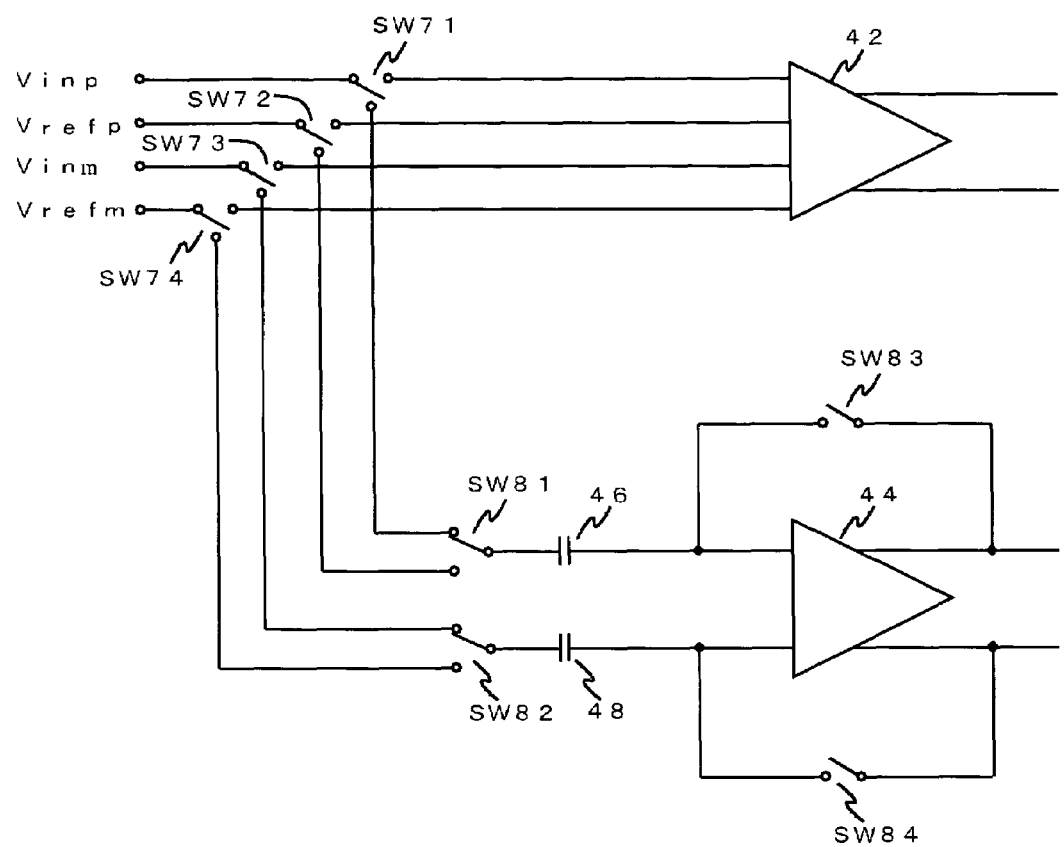
FIG. 20 illustrates a structure of the second A-D converter circuit shown in FIG. 18.

FIG. 20 illustrates a structure of the second A-D converter circuit 20 shown in FIG. 18. Though a single pair of four-input comparator 42 and two-input comparator 44 is shown in FIG. 20, there are actually a plurality of pairs of four-input comparators 42 and two-input comparators 44 wherein the number of pairs thereof corresponds to the number of reference voltages inputted to the second A-D converter circuit 20. The four-input comparators 42 and the two-input comparators 44 are contained in the second A-D converter circuit 20 of FIG. 18. The switches SW71 to SW74 input a positive-phase-side analog signal Vinp, a positive-phase-side reference voltage Vrefp, a reversed-phase-side analog signal Vinm and a reversed-phase-side reference voltage Vrefm selectively to the four-input comparator 42 or the two-input comparator 44. The selection of the switches SW71 to SW74 is controlled by a not-shown type switching signal Vcnt4 from the type control unit 32.

When the second A-D converter circuit 20 is to be operated as the gate-input type, the switches SW71 to SW74 select the four-input comparator 42. When the second A-D converter circuit 20 is to be operated as the capacitance-input type, the switches SW71 to SW74 select the two-input comparator 44. In the case of the capacitance-input type, the positive-phase-side analog signal Vinp and the positive-phase-side reference voltage Vrefp are inputted selectively to a first capacitor 46 via the switch SW81. The reversed-phase-side analog signal Vinm and the reversed-phase-side reference voltage Vrefm are inputted selectively to a second capacitor 48 via the switch SW82. The switches SW83 and SW84 are turned on during a non-operating period of the two-input comparator 44 and turned off during a comparative operation period of the two-input comparator 44. At the timing when the switch SW83 and the switch SW84 are switched from ON to OFF, the signal inputted then to the first capacitor 46 and the second capacitor 48 is sampled.

Figure 21:
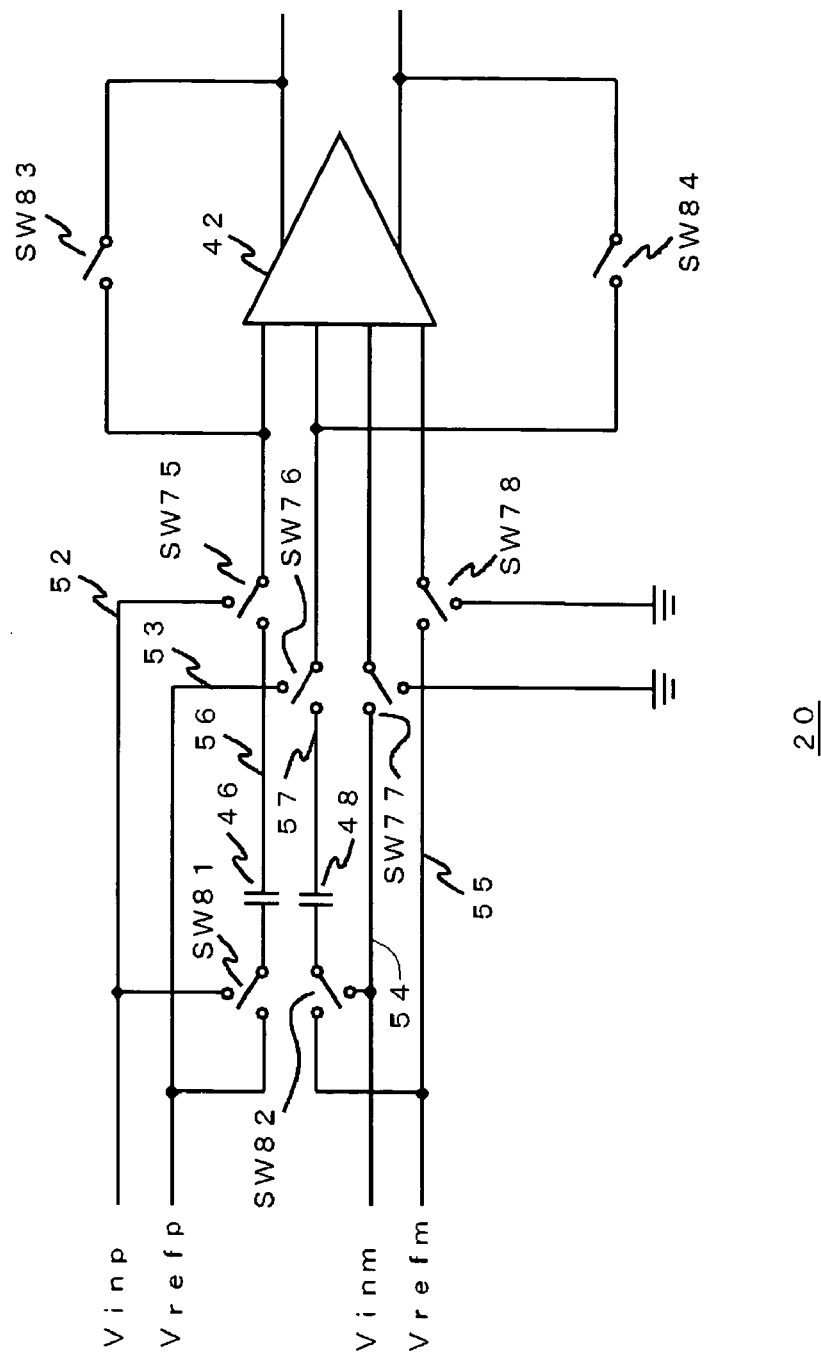
FIG. 21 illustrates another structure of the second A-D converter circuit shown in FIG. 18.

FIG. 21 illustrates another structure of the second A-D converter circuit 20 shown in FIG. 18. In FIG. 21, components identical to those in FIG. 20 are given the same reference numerals as in FIG. 20 and the explanation thereof are omitted as appropriate. Though a single four-input comparator 42 is shown in FIG. 21, there are actually a plurality of four-input comparators 42 wherein the number thereof corresponds to the number of reference voltages inputted to the second A-D converter circuit 20. A second A-D converter circuit shown in FIG. 21 includes a four-input comparator 42, switches SW75 to SW78, a first gate-input path 52 to a fourth gate-input path 55, a first select-input path 56, a second select-input path 57, a first capacitor 46, a second capacitor 48, and switches SW81 to SW84.

The first gate-input path 52 is a path in which the positive-phase-side analog signal Vinp is inputted fixedly. The second gate-input path 53 is a path in which the positive-phase-side reference voltage Vrefp is inputted fixedly. The third gate-input path 54 is a path in which the reversed-phase-side analog signal Vinm is inputted fixedly. The fourth gate-input path 55 is a path in which the reversed-phase-side reference voltage Vrefm is inputted fixedly. The first select-input path 56 is a path in which either the positive-phase-side analog signal Vinp or the positive-phase-side reference voltage Vrefp is selectively inputted via the first capacitor 46 by switching therebetween. The second select-input path 57 is a path in which either the reversed-phase-side analog signal Vinm or the reversed-phase-side reference voltage Vrefm is selectively inputted via the second capacitor 48 by switching therebetween. The switches SW75 to SW78 are switches that select path connected to the input terminal of the four-input comparator 42. The selection in the switches SW75 to SW78 is controlled by a type switching signal Vcnt4 (not shown) from the type control unit 32.

When the second A-D converter circuit 20 is to be operated as the gate-input type, the switches SW75 to SW78 select the first gate-input path 52 to the fourth gate-input path 55 as a path connected to the input terminal of the four-input comparator 42. When the second A-D converter circuit 20 is to be operated as the capacitance-input type, the switches SW75 and SW76 select the first select-input path 56 and the second select-input path 57 as a path connected to the input terminal of the four-input comparator 42. The switches SW77 and SW78 have the input terminal of the four-input comparator 42 connected to the ground. In FIG. 21, when the second A-D converter circuit 20 is to be operated as the gate-input type and when the second A-D converter circuit 20 is to be operated as the capacitance-input type, the four-input comparator 42 is put to a common use. Thereby, the circuit scale can be reduced.

The embodiments described above are merely exemplary, and it is understood by those skilled in the art that various further modifications to the combination of each component and process thereof are possible and such modifications are also within the scope of the present invention.

In the present embodiment, a description has been give of an example where the A-D converter circuit is shared in the conversion processing which is carried out a plurality of times, but the A-D converter circuit may not be put to the common use in the conversion processing performed a plurality of times. That is, the analog signal may instead be pipeline-processed in a manner that the operations undergoes a plurality of stages in a feedforward fashion. In such a case, the range of reference voltages in the A-D converter circuit that performs conversion to the final bit is set larger than the range of reference voltage in any of other A-D converter circuits, so that the same advantageous effects as with the first embodiment are obtained. Also, the A-D converter circuit that performs conversion to the final bit is operated under the first mode, whereas any of other A-D converter circuits is operated under the second mode, so that the same advantageous effects with the second embodiment are obtained. Also, the current supplied to a comparator in the A-D converter circuit that performs conversion to the final bit is set larger or smaller than the current supplied to any of other A-D converter circuits, so that the same advantageous effects as with the third embodiment is obtained. Also, the type of the A-D converter circuit that performs conversion to the final bit is set to the capacitance-input type, whereas the type of any of other A-D converter circuits is set to the gate-input type, so that the same advantageous effects as with the fourth embodiment are obtained.

In the second to the fourth embodiment, a description has been so given that the structure of the A-D converter 101 of FIG. 7 is the fundamental structure, but the techniques implemented in the second to the fourth embodiment is applicable to the structure of the A-D converter 100 of FIG. 1. In the present embodiments, the structure of the A-D converter is of a pipeline type and/or a cycle type, but it may be of a successive approximation type and so forth.

While the preferred embodiments of the present invention have been described using specific terms, such description is for illustrative purposes only, and it is to be understood that changes and variations may be made without departing from the spirit or scope of the appended claims.

What is claimed is:

1. An analog-to-digital converter, which converts an input analog signal to a digital value of a predetermined number of bits as a result of a plurality of conversions, the analog-to-digital converter comprising:
    a conversion unit which converts the input analog signal to a digital value of less than the predetermined number of bits; and
    a control unit which controls conversion accuracy of said conversion unit,
    wherein said conversion unit is put to a common use in a plurality n of conversions that include a conversion to the least significant bit, and
    in a case of n=2, said control unit controls a conversion accuracy of said conversion unit in a manner such that the conversion accuracy of said conversion unit at the time of converting to the least significant bit is set higher than the conversion accuracy of said conversion unit prior to the converting to the least significant bit and, in a case of n≧3, said control unit controls a conversion accuracy of said conversion unit in a manner such that the conversion accuracy of said conversion unit at the time of converting to the least significant bit is set higher than the conversion accuracy of any one of conversions by said conversion unit prior to the converting to the least significant bit.

2. An analog-to-digital converter according to claim 1, wherein in the case of n=2, said control unit performs a control in a manner such that a range of reference voltage in said conversion unit at the time of converting to the least significant bit is set larger than a range of reference voltages in said conversion unit in a conversion prior to the converting to the least significant bit and, in the case of n≧3, said control unit performs a control in a manner such that a range of reference voltages in said conversion unit at the time of converting to the least significant bit is set larger than a range of reference voltages in said conversion unit in any one of conversions prior to the converting to the least significant bit.

3. An analog-to-digital converter according to claim 1, wherein said conversion unit has a first mode and a second mode wherein the first mode is such that the input analog signal is sampled at the end of a non-operating period and the predetermined reference voltage is received during a comparative operation period and the second mode is such that the predetermined reference voltage is sampled at the end of a non-operating period and the input analog signal is received during a comparative period, and wherein in a case of n=2, said control unit performs a control in a manner such that the mode of said conversion unit, at the time of a conversion prior to converting to the least significant bit, is set to the second mode and the mode of said conversion unit, at the time of converting to the least significant bit, is set to the first mode and, in a case of n≧3, said control unit performs a control in a manner such that the mode of said conversion unit, at the time of any one of conversions by said conversion unit prior to converting to the least significant bit, is set to the second mode and the mode of said conversion unit, at the time of converting to the least significant bit, is set to the first mode.

4. An analog-to-digital converter according to claim 1, wherein in the case of n=2, said control unit performs a control in a manner such that a current supplied to a comparator included in said conversion unit at the time of converting to the least significant bit is varied relative to a current supplied to a comparator included in said conversion unit at the time of a conversion prior to the converting to the least significant bit and, in the case of n≧3, said control unit performs a control in a manner such that a current supplied to a comparator included in said conversion unit at the time of converting to the least significant bit is varied relative to a current supplied to a comparator included in said conversion unit at the time of any one of conversions prior to the converting to the least significant bit.

5. An analog-to-digital converter according to claim 1, wherein in the case of n=2, said control unit performs a control in a manner such that the level of a current supplied to a comparator included in said conversion unit at the time of converting to the least significant bit is set higher than the level of a current supplied to a comparator included in said conversion unit at the time of a conversion prior to the converting to the least significant bit and, in the case of n≧3, said control unit performs a control in a manner such that the level of a current supplied to a comparator included in said conversion unit at the time of converting to the least significant bit is set higher than the level of a current supplied to a comparator included in said conversion unit at the time of any one of conversions prior to the converting to the least significant bit.

6. An analog-to-digital converter according to claim 1, wherein in the case of n=2, said control unit performs a control in a manner such that the level of a current supplied to a comparator included in said conversion unit at the time of converting to the least significant bit is set lower than the level of a current supplied to a comparator included in said conversion unit at the time of a conversion prior to the converting to the least significant bit and, in the case of n≧3, said control unit performs a control in a manner such that the level of a current supplied to a comparator included in said conversion unit at the time of converting to the least significant bit is set lower than the level of a current supplied to a comparator included in said conversion unit at the time of any one of conversions prior to the converting to the least significant bit.

7. An analog-to-digital converter according to claim 1, wherein in the case of n=2, said control unit performs a control in a manner such that an operation of said conversion unit at the time of a conversion prior to converting to the least significant bit is set to a first type in which the input analog signal is inputted to a comparator included in said conversion unit without involving a capacitor, and performs a control in a manner such that an operation of said conversion unit at the time of the converting to the least significant bit is set to a second type in which the input analog signal is inputted to the comparator included in said conversion unit via a capacitor and, in the case of n≧3, said control unit performs a control in a manner such that an operation of said conversion unit at the time of any one of conversions prior to converting to the least significant bit is set to the first type and performs a control in a manner such that an operation of said converter at the time of the converting to the least significant bit is set to the second type.

8. An analog-to-digital converter, which converts an input analog signal to a digital value of a predetermined number of bits as a result of a plurality of conversions through m stages connected in series, the analog-to-digital converter characterized in that each of the stages includes a conversion unit which converts the input analog signal to a digital value of less than the predetermined number of bits, and in a case of m=2, the conversion accuracy of a conversion unit included in a subsequent stage among the m stages is set higher than the conversion accuracy of a conversion unit included in a stage prior to the subsequent stage and, in a case of m≧3, the conversion accuracy of a conversion unit included in a last stage among the m stages is set higher than the conversion accuracy of a conversion unit included in any one of stages prior to the last stage.

9. An analog-to-digital converter according to claim 8, wherein in the case of m=2, a range of reference voltages in the conversion unit included in the subsequent stage is set larger than a range of reference voltages in the conversion unit included in the stage prior to the subsequent stage and, in the case of m≧3, a range of reference voltages in the conversion unit included in the last stage is set larger than a range of reference voltages in a conversion unit included in any one of stages prior to the last stage.

10. An analog-to-digital converter according to claim 8, wherein in a case of m=2, an operation of said conversion unit included in the subsequent stage is a first mode in which the input analog signal is sampled at the end of a non-operating period and the predetermined reference voltage is received during a comparative operating period, and an operation of said conversion unit included in a stage prior to the subsequent stage is a second mode in which the predetermined reference voltage is sampled at the end of a non-operating period and the input analog signal is received during a comparative operating period, and wherein in a case of m≧3, an operation of said conversion unit included in a last stage is a first mode in which the input analog signal is sampled at the end of a non-operating period and the predetermined reference voltage is received during a comparative operating period, and an operation of said conversion unit included in any one of stages prior to the last stage is a second mode in which the predetermined reference voltage is sampled at the end of a non-operating period and the input analog signal is received during a comparative operating period.

11. An analog-to-digital converter according to claim 8, wherein in the case of m=2, the level of a current supplied to a comparator included in said conversion unit in the subsequent stage differs from the level of a current supplied to a comparator included in a stage prior to the subsequent stage, and in the case of m≧3, the level of a current supplied to a comparator included in said conversion unit in the last stage differs from the level of a current supplied to a comparator included in a conversion unit in any one of stages prior to the last stage.

12. An analog-to-digital converter according to claim 8, wherein in the case of m=2, a conversion unit included in a stage prior to the subsequent stage is of a first type in which the analog signal is inputted to a comparator of said conversion unit without involving a capacitor, and a conversion unit included in the last stage is of a second type in which the analog signal is inputted to a comparator of said conversion unit via a capacitor, and in the case of m≧3, any one of conversion units included in a stage prior to the last stage is of a first type in which the analog signal is inputted to a comparator of any one of said conversion units without involving a capacitor, and a conversion unit included in the last stage is of a second type in which the analog signal is inputted to a comparator of said conversion unit included in the last stage via a capacitor.

* * * * *